United States Patent
Darwish

(10) Patent No.: US 6,927,451 B1
(45) Date of Patent: Aug. 9, 2005

(54) TERMINATION FOR TRENCH MIS DEVICE HAVING IMPLANTED DRAIN-DRIFT REGION

(75) Inventor: Mohamed N. Darwish, Campbell, CA (US)

(73) Assignee: Siliconix Incorporated, Santa Clara, CA (US)

( * ) Notice: Subject to any disclaimer, the term of this patent is extended or adjusted under 35 U.S.C. 154(b) by 0 days.

(21) Appl. No.: 10/811,443

(22) Filed: Mar. 26, 2004

(51) Int. Cl.[7] .............................................. H01L 29/76
(52) U.S. Cl. ........................ 257/330; 257/334; 257/341; 257/394
(58) Field of Search .............................. 257/329–334, 257/341, 342, 394

(56) References Cited

U.S. PATENT DOCUMENTS

| | | | | |
|---|---|---|---|---|
| 5,614,751 A | * | 3/1997 | Yilmaz et al. | 257/394 |
| 5,723,891 A | * | 3/1998 | Malhi | 257/341 |
| 6,236,099 B1 | * | 5/2001 | Boden, Jr. | 257/495 |
| 6,388,286 B1 | * | 5/2002 | Baliga | 257/330 |
| 6,396,090 B1 | * | 5/2002 | Hsu et al. | 257/242 |
| 6,621,121 B2 | * | 9/2003 | Baliga | 257/330 |
| 6,700,158 B1 | * | 3/2004 | Cao et al. | 257/330 |
| 2004/0004238 A1 | * | 1/2004 | Qu | 257/296 |

* cited by examiner

Primary Examiner—T. N. Quach
(74) Attorney, Agent, or Firm—Silicon Valley Patent Group LLP

(57) ABSTRACT

A trench MIS device is formed in a semiconductor die that contains a P-epitaxial layer that overlies an N+ substrate and an N-epitaxial layer. In one embodiment, the device includes a drain-drift region that extends from the bottom of the trench to the N-epitaxial layer. A termination region of the die includes a half-trench at an edge of the die and an N-type region that extends from a bottom of the half-trench to the substrate. An insulating layer and an overlying metal layer extend from the surface of the epitaxial layer into the half-trench. Preferably, the elements of the termination region are formed during the same process steps that are used to form the active elements of the device.

8 Claims, 39 Drawing Sheets

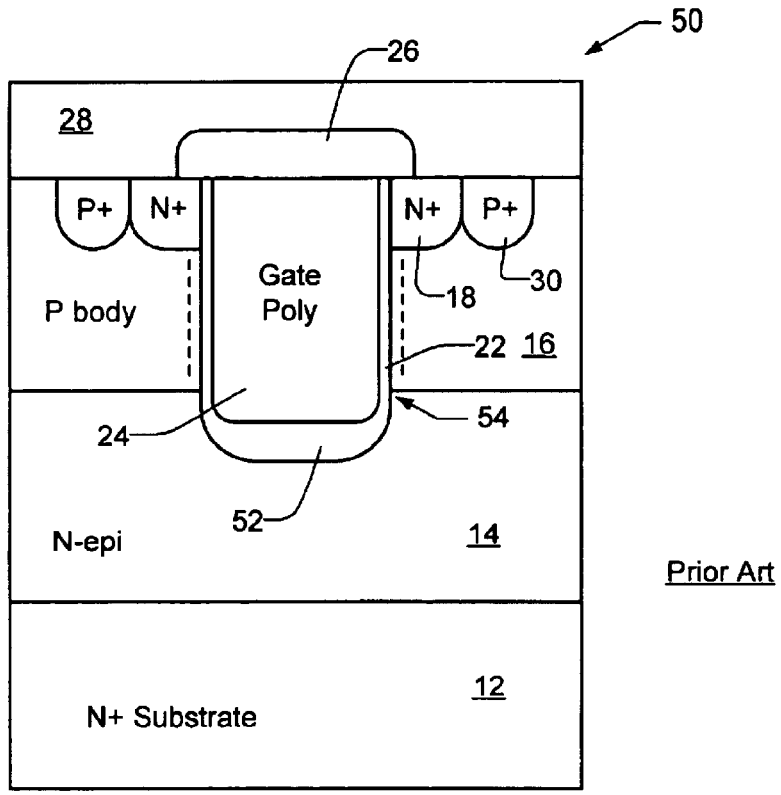
Fig. 3
Prior Art
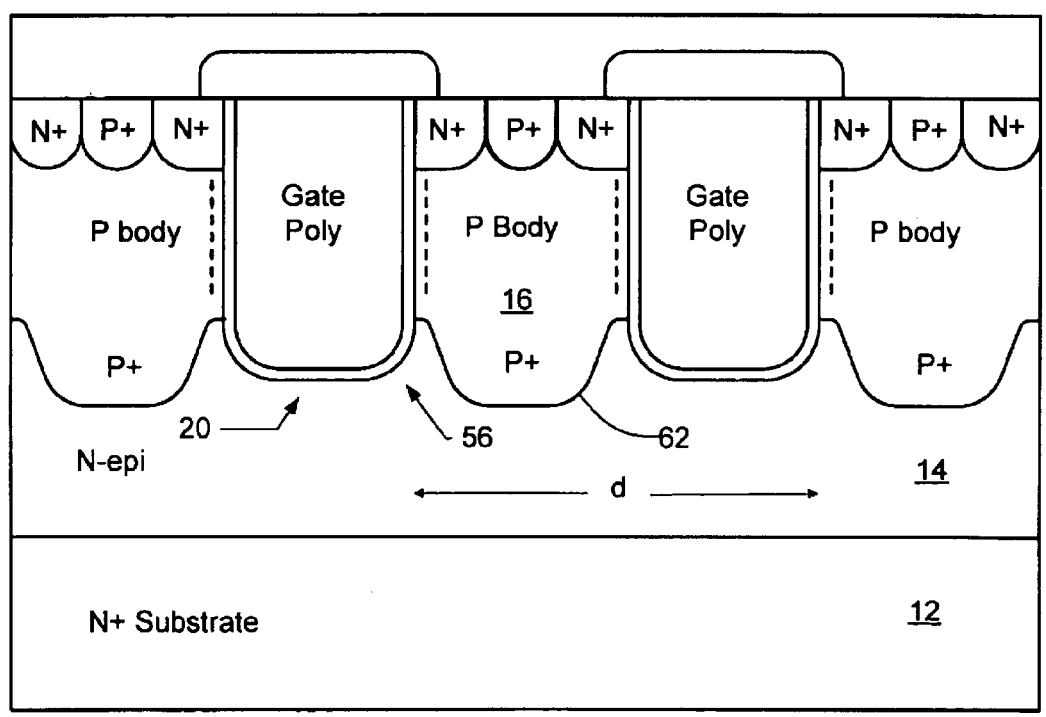
Prior Art    Fig. 4

US 6,927,451 B1

TERMINATION FOR TRENCH MIS DEVICE HAVING IMPLANTED DRAIN-DRIFT REGION

This application is related to the following applications: application Ser. No. 10/454,031, filed Jun. 4, 2003, which is a continuation-in-part of application Ser. No. 10/326,311, filed Dec. 19, 2002, which is a continuation-in-part of the following applications: application Ser. No. 10/317,568, filed Dec. 12, 2002, now U.S. Pat. No. 6,764,906, which is a continuation-in-part of application Ser. No. 09/898,652, filed Jul. 3, 2001, now U.S. Pat. No. 6,569,738; application Ser. No. 10/176,570, filed Jun. 21, 2002, now U.S. Pat. No. 6,708,930; and application Ser. No. 10/106,812, filed Mar. 26, 2002, which is a continuation-in-part of application Ser. No. 09/927,143, filed Aug. 10, 2001, now U.S. Pat. No. 6,849,898. Each of the foregoing applications is incorporated herein by reference in its entirety.

FIELD OF THE INVENTION

This invention relates to trench-gated power MOSFETs with superior on-resistance and breakdown characteristics and in particular to trench MOSFETs that are suitable for high frequency operation. This invention also relates to a process for manufacturing such a MOSFET.

BACKGROUND OF THE INVENTION

Some metal-insulator-semiconductor (MIS) devices include a gate located in a trench that extends downward from the surface of a semiconductor substrate (e.g., silicon). The current flow in such devices is primarily vertical and, as a result, the cells can be more densely packed. All else being equal, this increases the current carrying capability and reduces the on-resistance of the device. Devices included in the general category of MIS devices include metal-oxide-semiconductor field effect transistors (MOSFETs), insulated gate bipolar transistors (IGBTs), and MOS-gated thyristors.

Trench MOSFETs, for example, can be fabricated with a high transconductance ($g_{m,max}$) and low specific on-resistance ($R_{on}$), which are important for optimal linear signal amplification and switching. One of the most important issues for high frequency operation, however, is reduction of the MOSFET's internal capacitances. The internal capacitances include the gate-to-drain capacitance ($C_{gd}$), which is also called the feedback capacitance ($C_{rss}$), the input capacitance ($C_{iss}$), and the output capacitance ($C_{oss}$).

FIG. 1 is a cross-sectional view of a conventional n-type trench MOSFET 10. In MOSFET 10, an n-type epitaxial ("N-epi") layer 14 is grown on an N+ substrate 12. N-epi layer 14 may be a lightly doped layer, that is, an N− layer. A p-type body region 16 separates N-epi layer 14 from N+ source regions 18. Current flows vertically through a channel (denoted by the dashed lines) along the sidewall of a trench 20. The sidewall and bottom of trench 20 are lined with a thin gate insulator 22 (e.g., silicon dioxide). Trench 20 is filled with a conductive material, such as doped polysilicon, which forms a gate 24. Trench 20, including gate 24 therein, is covered with an insulating layer 26, which may be borophosphosilicate glass (BPSG). Electrical contact to source regions 18 and body region 16 is made with a conductor 28, which is typically a metal or metal alloy. A body contact region 30 facilitates ohmic contact between metal 28 and P body 16. Gate 24 is contacted in the third dimension, outside of the plane of FIG. 1.

A significant disadvantage of MOSFET 10 is a large overlap region formed between gate 24 and N-epi layer 14, which subjects a portion of thin gate insulator 22 to the drain operating voltage. The large overlap limits the drain voltage rating of MOSFET 10, presents long term reliability issues for thin gate insulator 22, and greatly increases the gate-to-drain capacitance, $C_{gd}$, of MOSFET 10. In a trench structure, $C_{gd}$ is larger than in conventional lateral devices, limiting the switching speed of MOSFET 10 and thus its use in high frequency applications.

One possible method to address this disadvantage is described in application Ser. No. 09/591,179 and is illustrated in FIG. 2. FIG. 2 is a cross-sectional view of a trench MOSFET 40 with an undoped polysilicon plug 42 near the bottom of trench 20. MOSFET 40 is similar to MOSFET 10 of FIG. 1, except for polysilicon plug 42, which is isolated from the bottom of trench 20 by oxide layer 22 and from gate 24 by oxide layer 44. The sandwich of oxide layer 22, polysilicon plug 42, and oxide layer 44 serves to increase the distance between gate 24 and N-epi layer 14, thereby decreasing $C_{gd}$.

In some situations, however, it may be preferable to have a material that is a better insulator than undoped polysilicon in the bottom of trench 19 to minimize $C_{gd}$ for high frequency applications.

One possible method to address this issue is described in application Ser. No. 09/927,320 and is illustrated in FIG. 3. FIG. 3 is a cross-sectional view of a trench MOSFET 50 with a thick oxide layer 52 near the bottom of trench 20. Thick oxide layer 52 separates gate 24 from N-epi layer 14. This circumvents the problems that occur when only thin gate insulator 15 separates gate 24 from N-epi layer 14 (the drain) as in FIG. 1. Thick oxide layer 52 is a more effective insulator than polysilicon plug 42 as shown in FIG. 2, and this decreases the gate-to-drain capacitance, $C_{gd}$, of MOSFET 50 compared to MOSFET 40 of FIG. 2.

Nonetheless, the solution of FIG. 3 still has a thin gate oxide region 54 between body region 16 and thick oxide layer 52. This is because the lower junction of body region 16 and the top edge of thick oxide layer 52 are not self-aligned. If body region 16 extends downward past the top edge of thick oxide layer 52, MOSFET 50 could have a high on-resistance, $R_{on}$, and a high threshold voltage. Since this alignment is difficult to control in manufacturing, a substantial margin of error must be allowed to prevent an overlap between body region 16 and thick oxide layer 52, and this can lead to significant gate-to-drain overlap in thin gate oxide region 54. Thin gate region 54 also exists in MOSFET 40 of FIG. 2, between body region 16 and polysilicon plug 42. Thus, $C_{gd}$ can still be a problem for high frequency applications. Accordingly, a trench MOSFET with decreased gate-to-drain capacitance, $C_{gd}$, and better high frequency performance is needed.

Another problem with trench MIS devices relates to the strength of the electric field at the corner of the trench, represented, for example, by corner 56 shown in FIG. 1. The field strength is at a maximum at the corner of the trench, and therefore this is normally the location at which avalanche breakdown occurs. Avalanche breakdown generally leads to the generation of hot carriers, and when breakdown occurs near the gate oxide layer, the hot carriers may be injected into the gate oxide layer. This can damage or rupture the gate oxide layer and presents long-term reliability problems for the device. It is preferable for breakdown to take place in the bulk silicon, away from the gate oxide layer.

One technique for reducing the strength of the electric field at the corners of the trench and promoting breakdown in the bulk silicon away from the trench is taught in U.S. Pat.

No. 5,072,266. This technique is illustrated in FIG. 4, which shows a MOSFET 60 MOSFET 60 is similar in MOSFET 10 of FIG. 1 except that a deep P+ diffusion 62 extends downward from the P body 16 to a level below the bottom of trench 20. Deep P+ diffusion 62 has the effect of shaping the electric field in such a way as to reduce its strength at the corner 56 of the trench.

While the technique of U.S. Pat. No. 5,072,266 improves the breakdown performance of the MOSFET, it sets a lower limit on the cell pitch, shown as "d" in FIG. 4, because if the cell pitch is reduced too much, dopant from the deep P+ diffusion will get into the channel region of the MOSFET and increase its threshold voltage. Reducing the cell pitch increases the total perimeter of the cells of the MOSFET, providing a greater gate width for the current, and thereby reduces the on-resistance of the MOSFET. Thus, the net effect of using the technique of the Bulucea patent to improve the breakdown characteristics of the MOSFET is that it becomes more difficult to reduce the on-resistance of the MOSFET.

To summarize, there is a clear need for an MIS structure that provides a low on-resistance and threshold voltage and yet is capable of high-frequency operation.

SUMMARY OF THE INVENTION

In an MIS device according to this invention, substrate of a first conductivity type is overlain by an epitaxial ("epi") layer of a second conductivity type. A trench is formed in the epi layer, and a gate is located in the trench, separated from the epi layer by an oxide or other insulating layer.

To minimize the gate-to-drain capacitance $C_{gd}$ a thick insulating layer, preferably oxide, is formed on the bottom of the trench. The trench is lined with a relatively thick layer of, for example, nitride, and the nitride layer is directionally etched to remove the nitride layer from the bottom of the trench. At this point a dopant of the first conductivity type is implanted through bottom of the trench to form a drain-drift region extending from the trench bottom to the substrate.

The thick insulating layer can be formed in several ways. An oxide or other insulating layer can be deposited by, for example, chemical vapor deposition (CVD), and the thick insulating layer may be etched back until only a "plug" remains on the bottom of the trench. An oxide layer may be thermally grown on the bottom of the trench. A deposition process may be carried out in such a way that the deposited material (e.g., oxide) deposits preferentially on the silicon at the bottom of the trench as opposed to the material (e.g., nitride) that lines the sidewalls of the trench.

After the thick insulating layer has been formed on the bottom of the trench, the material lining the sidewalls of the trench is removed. A relatively thin gate oxide layer is formed on the sidewalls of the trench, and the trench is filled with a conductive gate material such as doped polysilicon. A threshold adjust or body implant may be performed, and source regions of the first conductivity type are formed at the surface of the epi layer.

The drain-drift region can be formed in several ways. A dopant of the second conductivity type may be implanted through the bottom of the trench at a dose and energy such that it extends from the trench bottom to the substrate with no diffusion. Alternatively, the dopant of the second conductivity type may be implanted through the trench bottom at a lower energy such that it initially forms a region of the second conductivity type just below the trench bottom, and the dopant may diffused downward to the substrate by subjecting the structure to an elevated temperature for a predetermined period of time. Alternatively, a layer of the second conductivity type may be implanted to a location at or near the interface between the epi layer and the substrate, and the dopant may diffused upward to the bottom of the trench. The foregoing processes may be combined: a region of the second conductivity type may be formed just below the trench bottom and a layer of the second conductivity type may be implanted to a location at or near the interface between the epi layer and the substrate, and the structure maybe heated to cause the region and the layer to merge. A series of implants may be performed to create drain-drift region that includes a "stack" of second conductivity type regions between the trench bottom and the substrate.

The MIS device that results from this process has a thick oxide or other insulating layer at the bottom of the trench and a drain-drift region that extends from the bottom of the trench to the substrate. The junctions of the drain-drift region are preferably self-aligned with the edges of the thick insulating layer. This minimizes the gate-to-drain capacitance without running the risk of impairing the threshold voltage or on-resistance of the device. At the center of the MOSFET cells, the P-epi layer extends below the level of the trench bottom, assuring that any breakdown will take place away from the gate oxide layer. There is no deep implant of the kind taught in U.S. Pat. No. 5,072,266, however, so the cell pitch may be set without concern that dopant of the second conductivity type will get into the channel region and adversely affect the threshold voltage of the device.

To increase the breakdown voltage of the device, a lightly-doped epi layer of the first conductivity type may be formed on top of the substrate.

According to another aspect of the invention, an edge termination region is fabricated using essentially the same process steps that are used to fabricate the trench and drain-drift region.

BRIEF DESCRIPTION OF THE DRAWINGS

FIG. 3 shows a trench MOSFET with a thick oxide layer near the bottom of the trench.

FIG. 4 shows a MOSFET with a deep P+ diffusion extending downward to a level below the bottom of the trench near the center of the cell.

DESCRIPTION OF THE INVENTION

Figure 1:
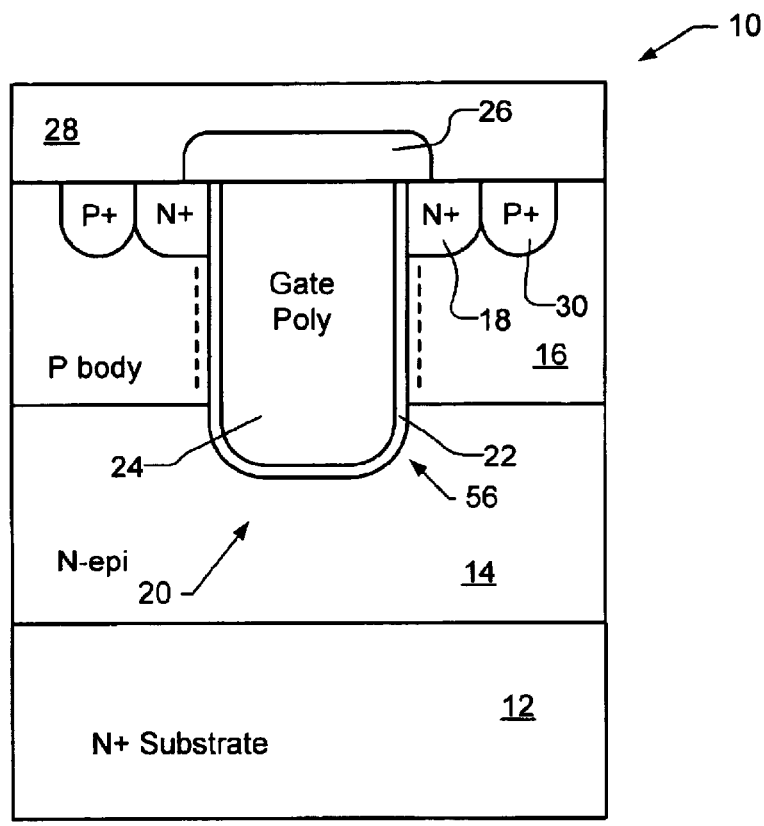
FIG. 1 shows a conventional trench MOSFET formed in an N epi layer overlying an N+ substrate.
Figure 2:
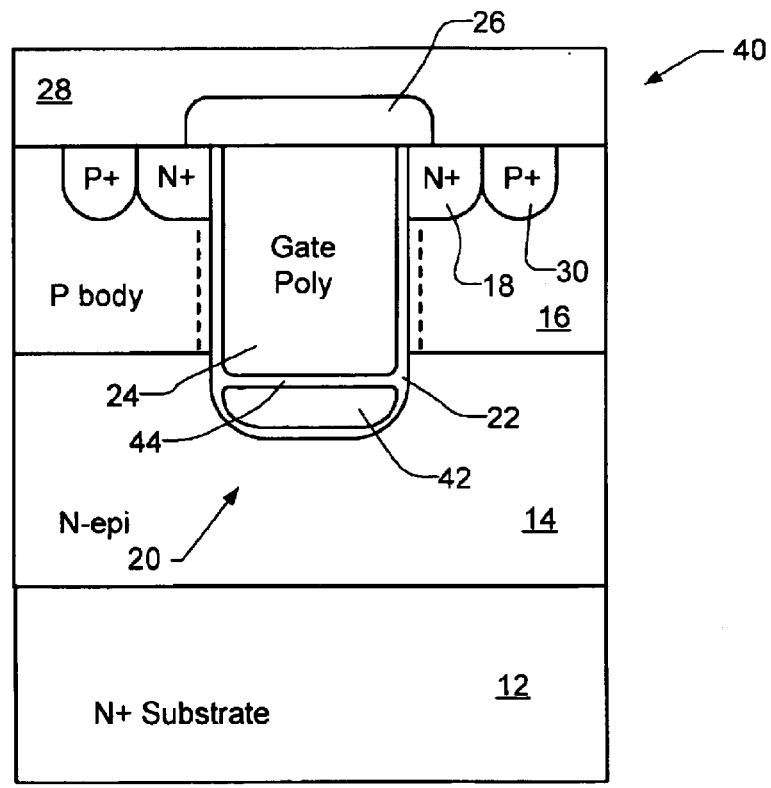
FIG. 2 shows a trench MOSFET with an undoped polysilicon plug near the bottom of the trench.
Figure 5A:
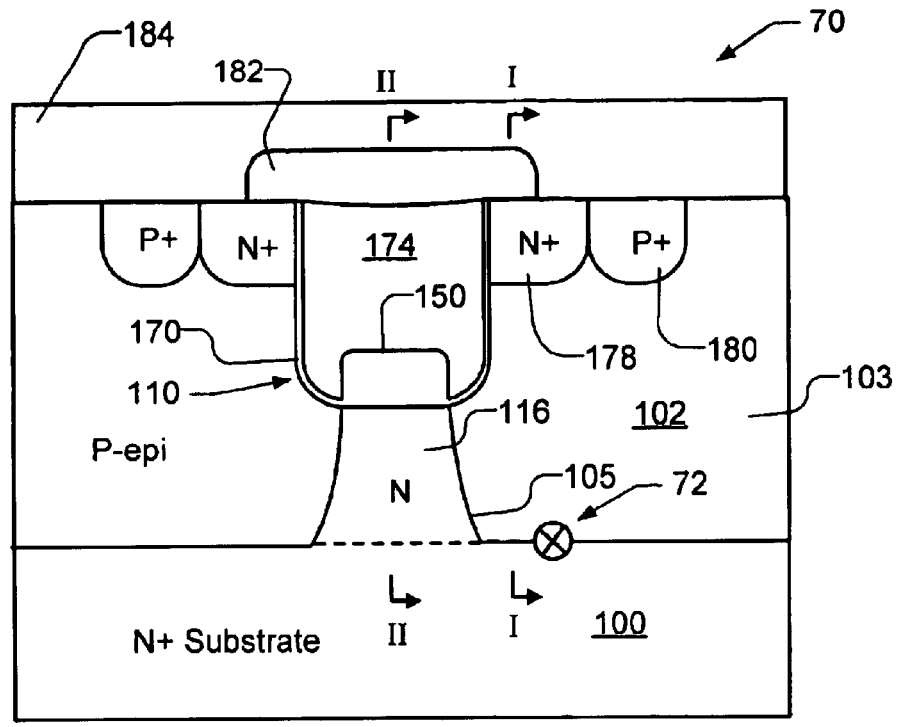
FIG. 5A shows an MIS device in accordance with this invention.

FIG. 5A shows a typical MIS device 70 in accordance with this invention. MIS device 70 is a MOSFET, but it could be another type of MIS device, such as an insulated gate bipolar transistor (IGBT), or a MOS-gated thyristor.

MIS device 70 is formed in an epitaxial ("epi") layer 102, which is generally doped with P-type impurity and which lies on top of an N+substrate 100. N+ substrate 100, which forms the drain of the device, can have a resistivity of from $5 \times 10^{-4}$ ohm-cm to $5 \times 10^{-3}$ ohm-cm, for example, and P-epi layer 102 can be doped with boron to a concentration of from $1 \times 10^{15}$ cm$^{-3}$ to $5 \times 10^{17}$ cm$^{-3}$. N+ substrate 100 is typically about 200 microns thick and epi layer 102 could be from 2 microns to 5 microns thick.

A trench 110 is formed in P-epi layer 102, the trench 110 being lined with a gate oxide layer 170 and being filled with polysilicon with serves as a gate 174. An N+ source region 178 and a P+ body contact region 180 are formed at the surface of P-epi layer 102. The remaining portion of P-epi layer 102 forms a P-type base or body 103. Body 103 forms a junction with the N+ substrate 100 that is substantially coincident with the interface between the P-epi layer 102 and N+substrate 100.

Electrical contact is made to N+ source region 178 and P+ body contact region 180 by a metal layer 184. A borophosphosilicate glass (BPSG) layer 182 insulates gate 174 from metal layer 184. Gate 174 is contacted electrically in the third dimension, outside the plane of the drawing.

In accordance with this invention, the drain of device 70 includes (a) an N-type drain-drift region 116, which extends between the bottom of trench 110 and N+ substrate 100, and (b) a thick bottom oxide region 150, which is formed in the trench 110 adjacent to drain-drift region 116. A junction 105 between N drain-drift region 116 and P body 103 extends between N+ substrate 100 and trench 110. N drain-drift region 116 can be doped, for example, with phosphorus to a concentration of from $5 \times 10^{15}$ cm$^{-3}$ to $5 \times 10^{17}$ cm$^{-3}$.

Figure 7A:
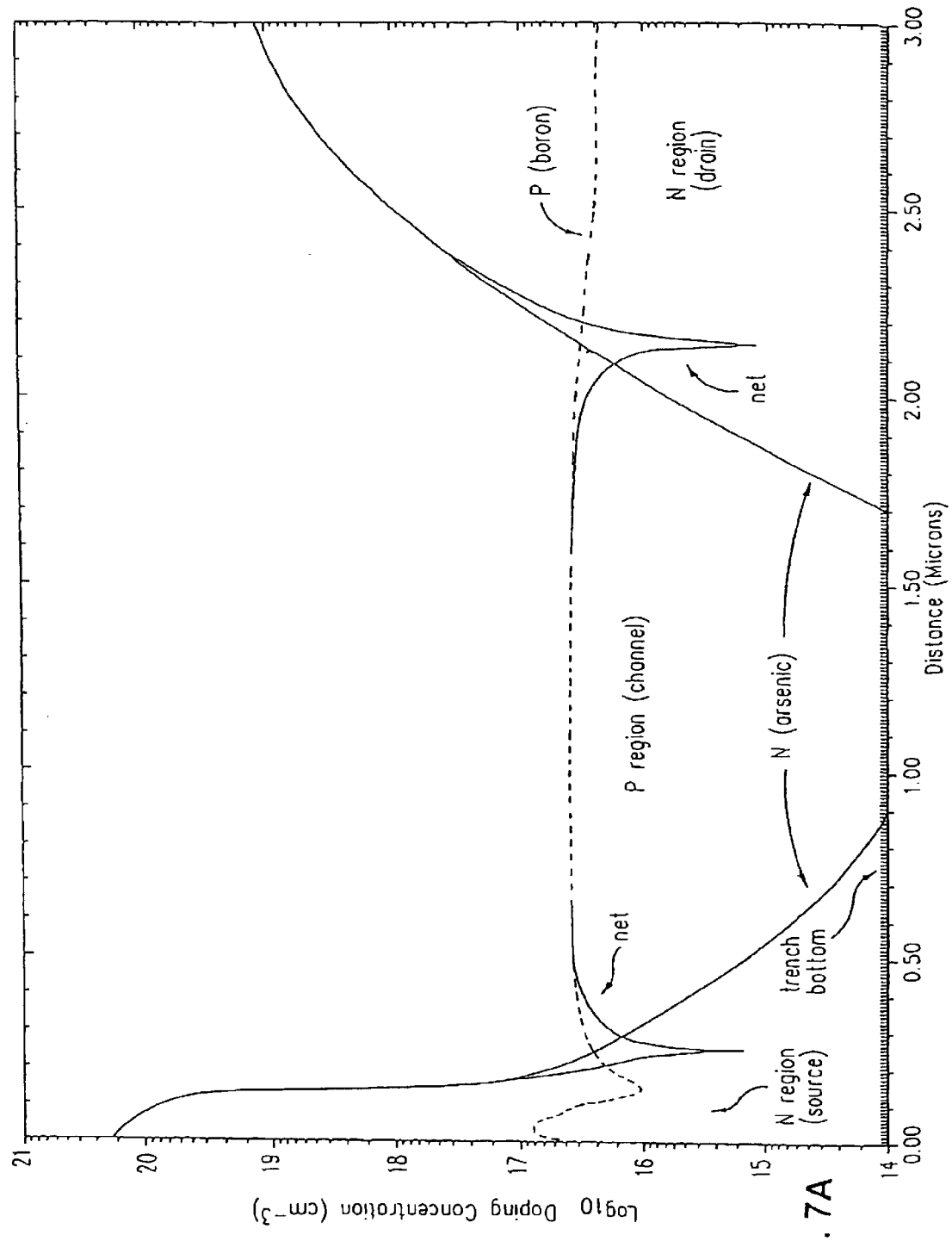
FIGS. 7A and 7B are graphs prepared using the computer simulation program SUPREME, showing the dopant concentrations in the MOSFET of FIG. 5A at vertical cross-sections through the channel region and the bottom of the trench, respectively.
Figure 7B:
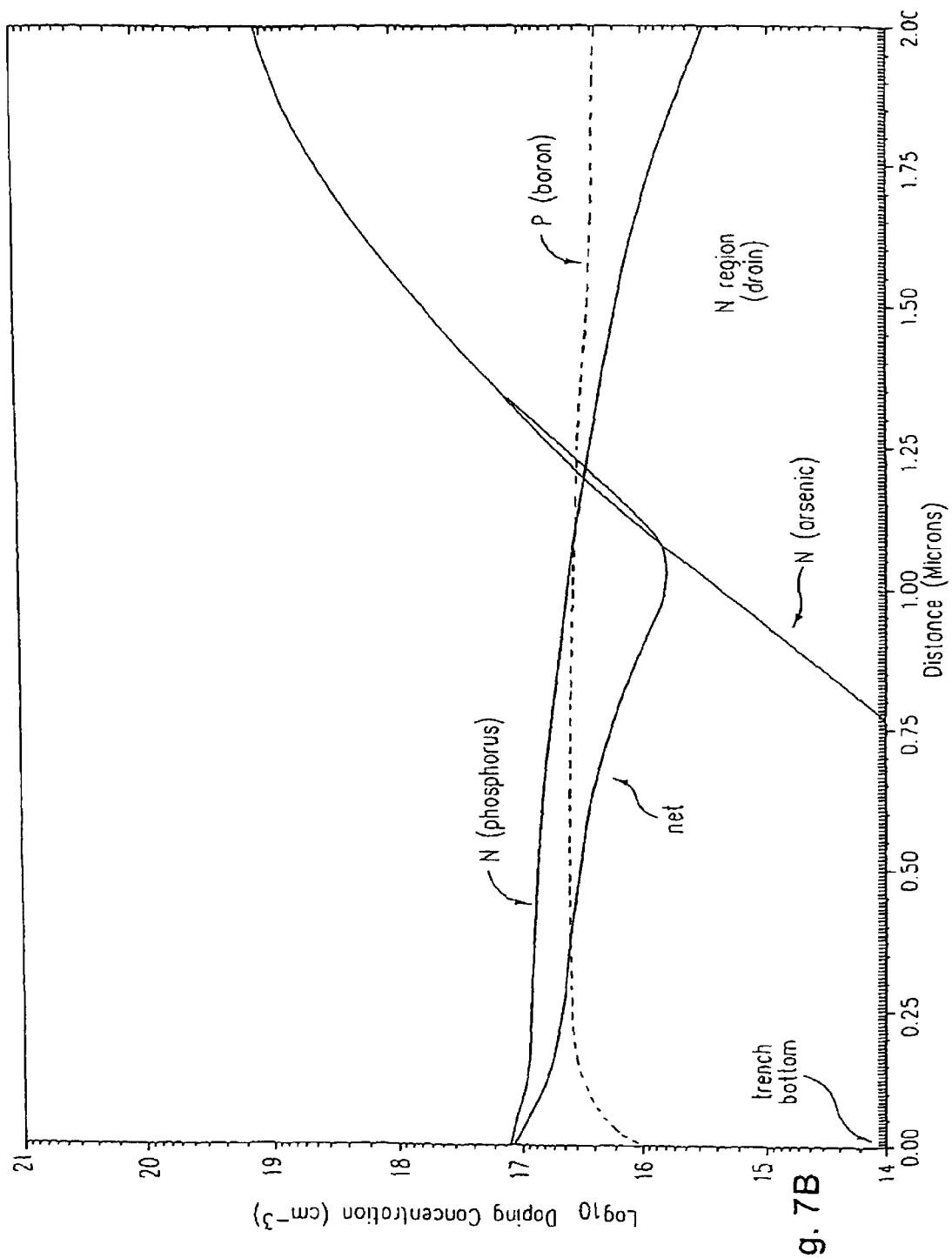

FIG. 7A is a graph of the doping concentration in MOSFET 70. The graph was prepared by the computer simulation program SUPREME and is taken at a vertical section through the channel region, designated I—I in FIG. 5A. The curves indicated show the doping concentrations of arsenic and boron, and the third curve shows the net doping concentration. FIG. 7B is a similar graph taken at a vertical section transecting the bottom of the trench designated II—II in FIG. 5A. The horizontal axis of FIG. 7A is the distance in microns below the surface of the P-epi layer, the horizontal axis of FIG. 7B is the distance in microns below the bottom of the trench. The vertical axis of FIGS. 7A and 7B is the logarithm$_{10}$ of the doping concentration in atoms/cm$^{-3}$. Note that in FIG. 7A the concentration of boron, which is the background dopant in P-epi layer 102, is relatively flat and dominates in the channel region. The doping concentration of arsenic increases as one moves from the channel region into the source or the drain.

Figure 8A:
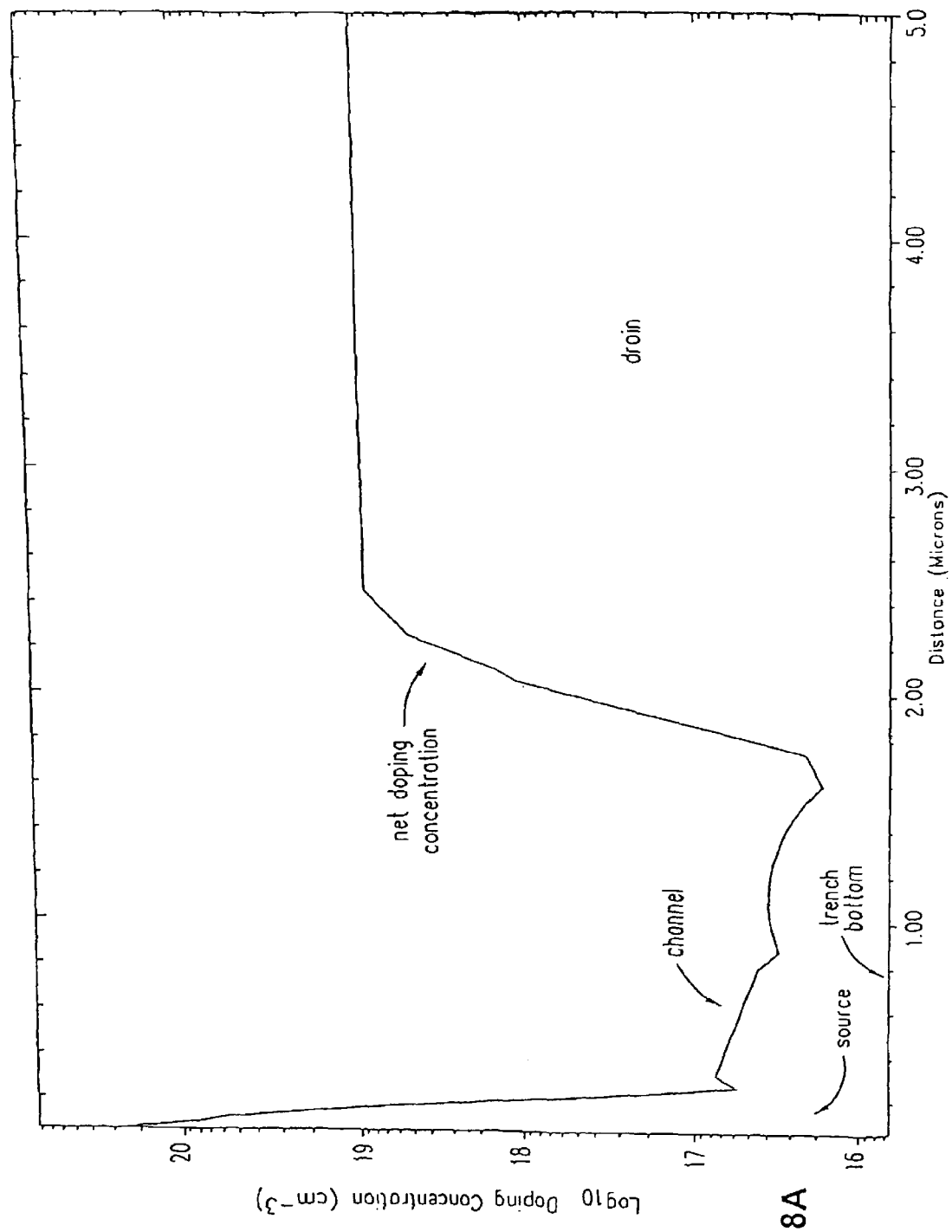
FIGS. 8A and 8B are graphs prepared using the computer simulation program MEDICI, showing the dopant concentrations in the MOSFET of FIG. 5A at vertical cross-sections through the channel region and the bottom of the trench, respectively.
Figure 8B:
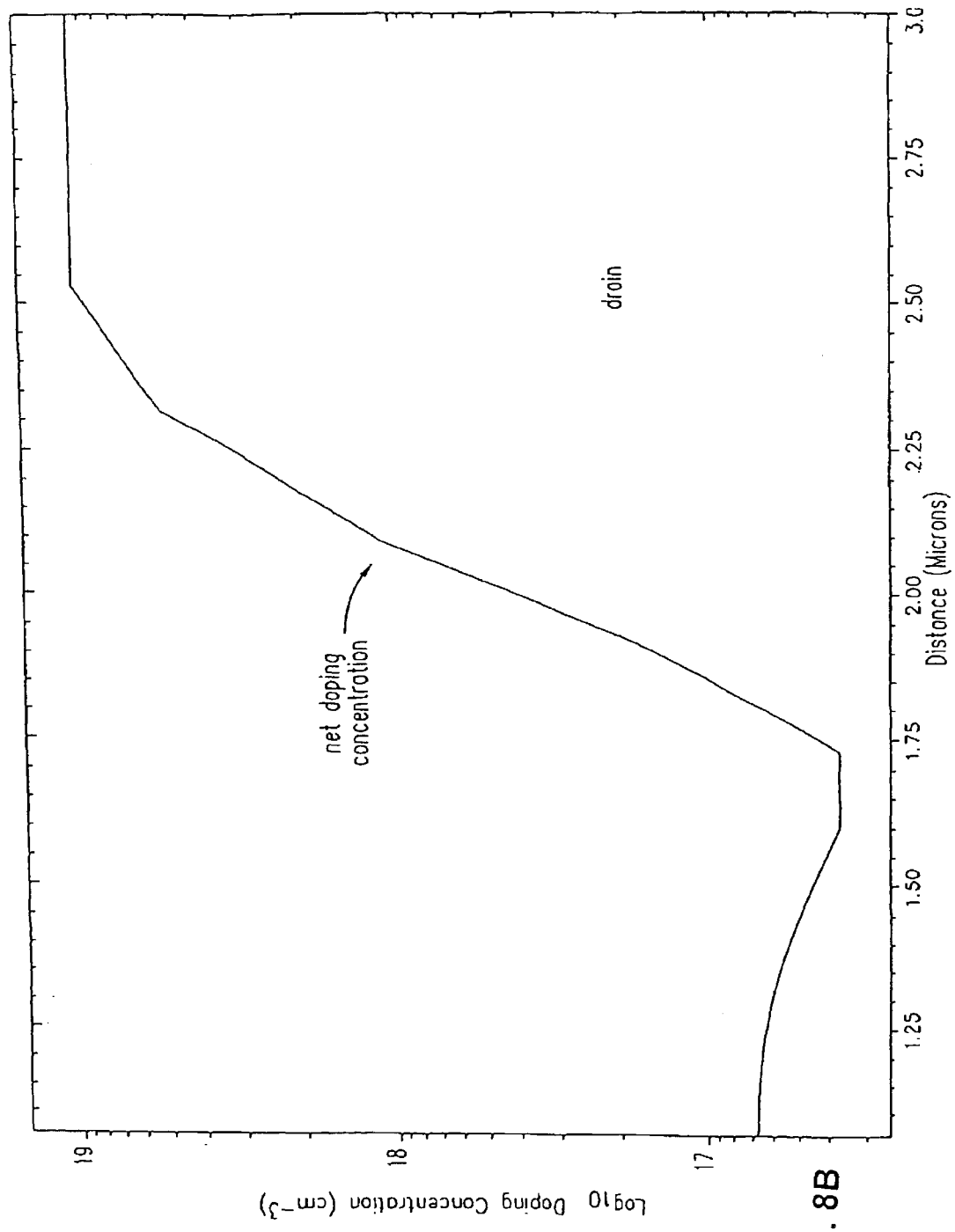

FIGS. 8A and 8B are graphs of the doping concentration at the same sections, respectively, as FIGS. 7A and 7B. FIGS. 8A and 8B, however, were prepared using the computer simulation program MEDICI and show only the net doping concentration whether N-type or P-type.

The SUPREME and MEDICI simulations differ in that SUPREME considers only the doping concentrations at a single vertical cross-section, without taking into account the effect of dopants at other laterally displaced positions, while MEDICI takes into account all dopants in the two-dimensional plane of the drawing.

The following are among the advantages of MOSFET 70:

1. Avalanche breakdown will generally occur at the interface between the N+ substrate 100 and the P-epi layer 102, away from the trench (e.g., at the location designated 72 in FIG. 5A). This avoids damage to the gate oxide layer 170 from the hot carriers generated in the area of the breakdown.

2. The gate oxide 170 at the corners of the trench, where the electric field reaches a maximum, is protected from rupture.

Figure 5B:
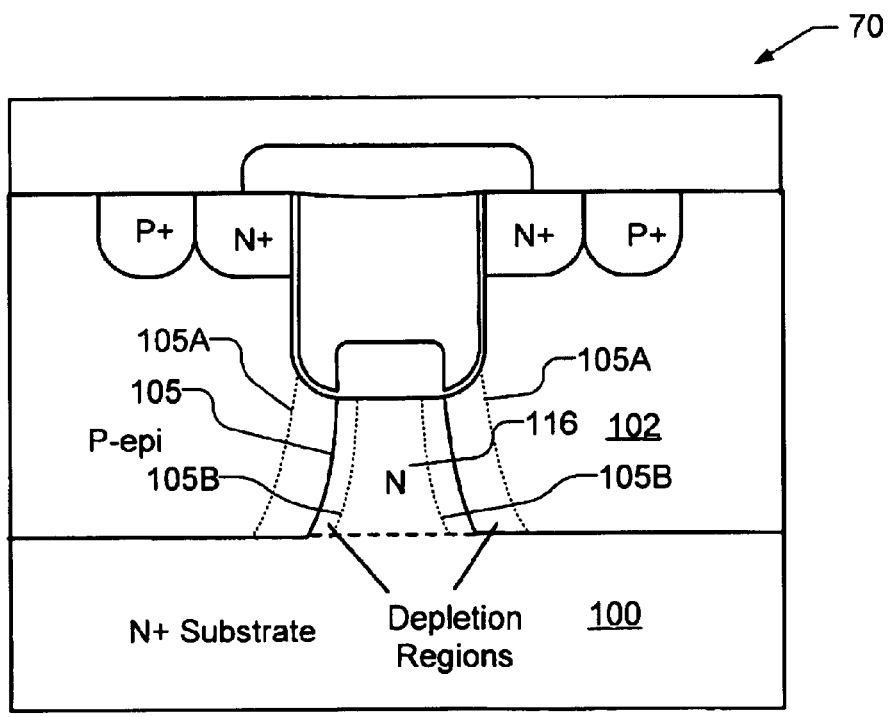
FIG. 5B shows the depletion regions that form in the MIS device of FIG. 5A when the device is reverse biased.

3. A higher punchthrough breakdown can be obtained for a given threshold voltage. The junctions 105 between the N drain-drift region 116 and the P body 103 extend downward to the N+ substrate 100. As shown in FIG. 5B, when PN junctions 105 are reverse-biased, as they are when MOSFET 70 is in an off condition and is blocking current, the depletion regions, denoted by the dashed lines 105A, 105B, extend along the entire length of junctions 105, and as a result the depletion region in the area of the channel does not expand as quickly towards the source region. The expansion of the depletion regions towards the source region is the condition that causes punchthrough breakdown.

Figure 9A:
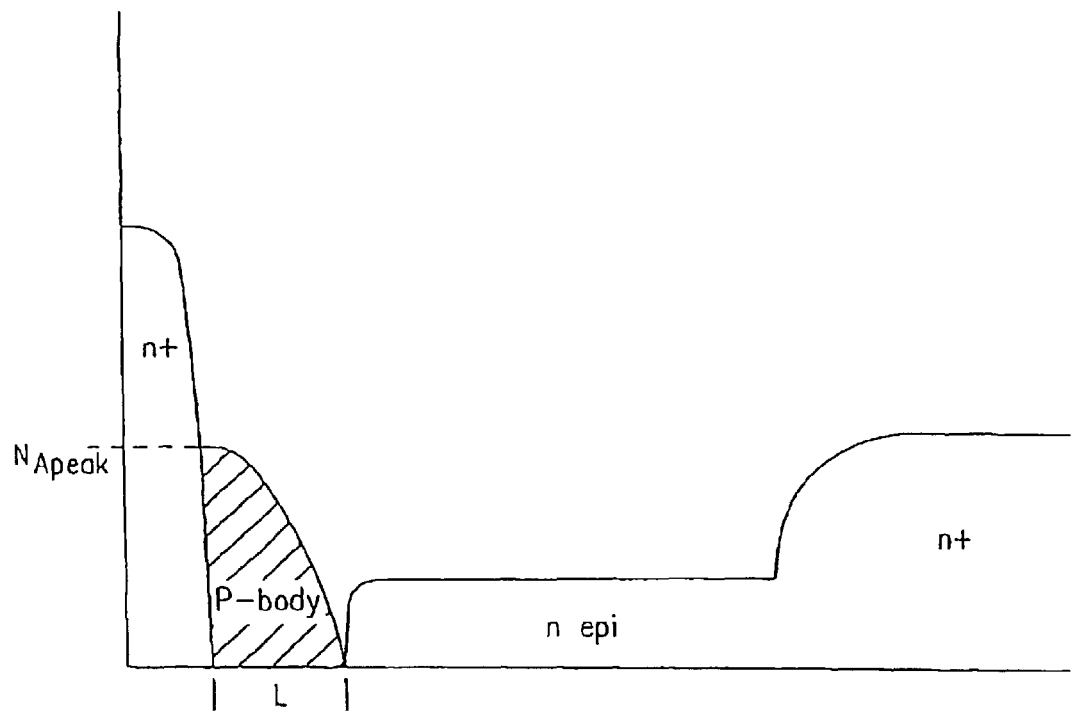
FIG. 9A is a graph of the doping profile taken at a vertical cross-section through the channel of a conventional MOSFET such as the one shown in FIG. 1 showing that the doping concentration in the channel region declines rapidly in the direction towards the drain.
Figure 9B:
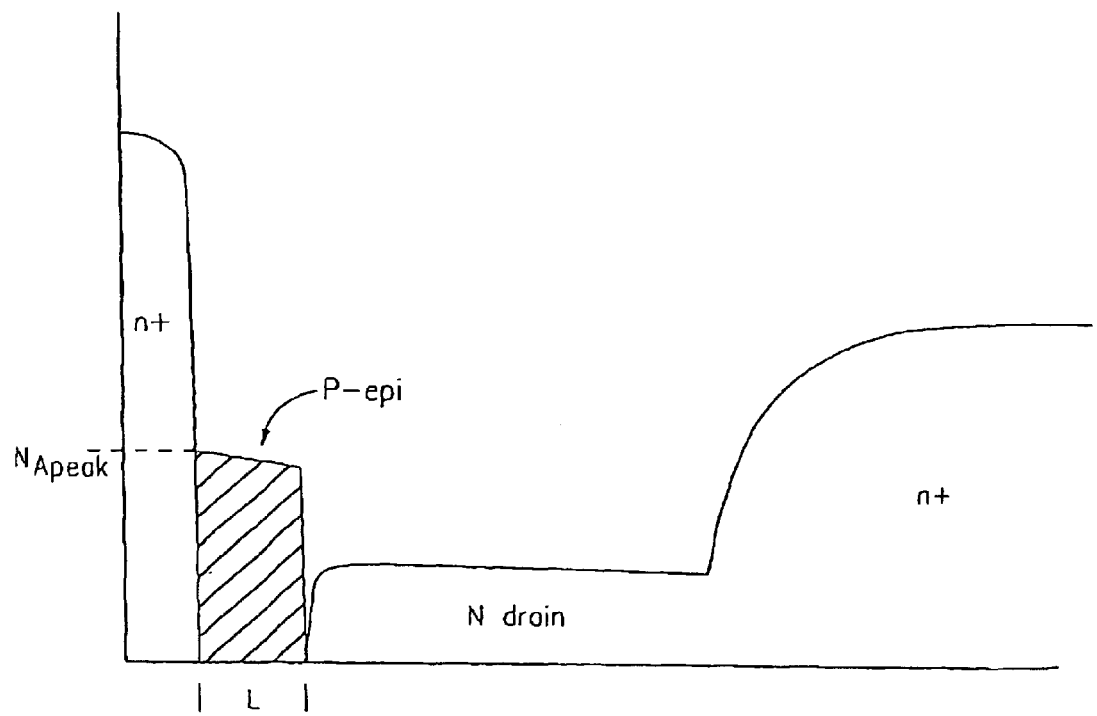
FIG. 9B is another graph of the doping profile taken at a vertical cross-section through the channel of a MOSFET illustrating that the doping concentration in the channel region is relatively constant.

4. Moreover, a higher punchthrough breakdown voltage can be obtained for a given threshold voltage. As shown in FIG. 9A, in a conventional MOSFET having a diffused body, the dopant concentration of the body falls off rapidly as one approaches the N-epi (drift region). The threshold voltage is determined by the peak doping concentration $N_{A\ Peak}$. The punchthrough breakdown voltage is determined by the total amount of charge $Q_{channel}$ in the channel region (represented by the area under the P body curve in FIG. 9A). In a MOSFET of this invention the doping profile of the P body region is relatively flat, as shown in FIG. 9B. Therefore, $N_{A\ peak}$ can be the same while the total charge in the channel is greater, providing a higher punchthrough breakdown voltage.

5. Since there is no deep body diffusion in each cell (of the kind taught in U.S. Pat. No. 5,072,266) the cell pitch can be reduced without concern that additional P-type dopant will get into the channel region, raising the threshold voltage of the MOSFET. Thus the cell packing density can be increased. This reduces the on-resistance of the device.

6. In a conventional trench MOSFET a lightly-doped "drift region" is often formed between the channel and the heavily-doped substrate. The doping concentration in the drift region must be kept below a certain level. Otherwise effective depletion is not obtained and the strength of the electric field at the corner of the trench becomes too great. Keeping the doping concentration in the drift region low, however, increases the on-resistance of the device. In contrast, the N drain-drift region 116 of this invention can be doped more heavily because the shape of N drain-drift region 116 and the length of junction 105 between N drain-drift region 116 and P body region 103 provide more effective depletion. A more heavily doped N drain-drift region 116 reduces the on-resistance of the device.

Figure 19A:
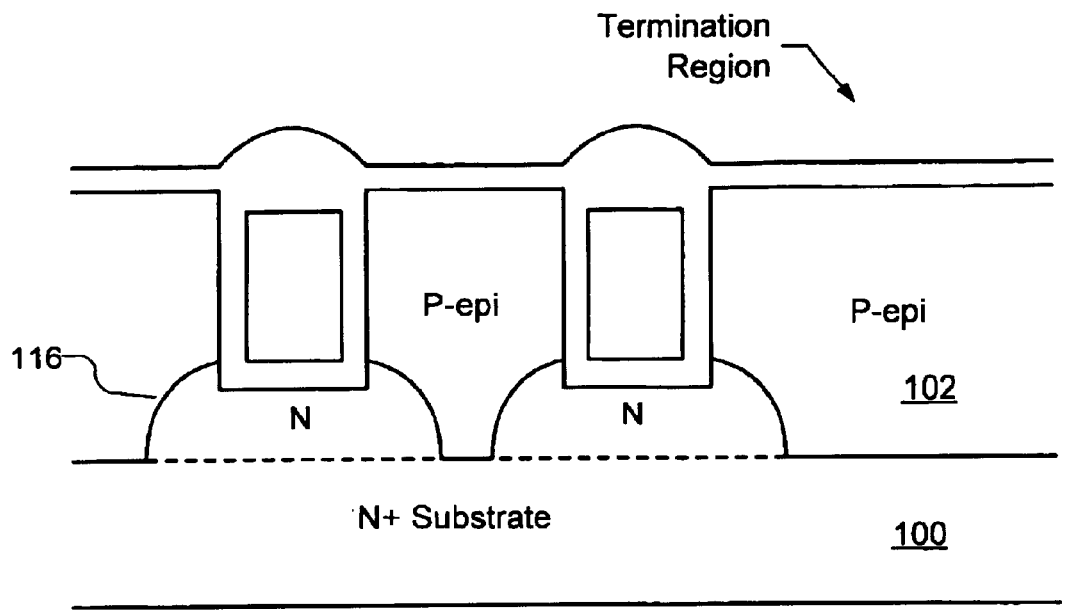
FIGS. 19A and 19B illustrate how the invention simplifies the creation of an edge termination region in an MIS device.
Figure 19B:
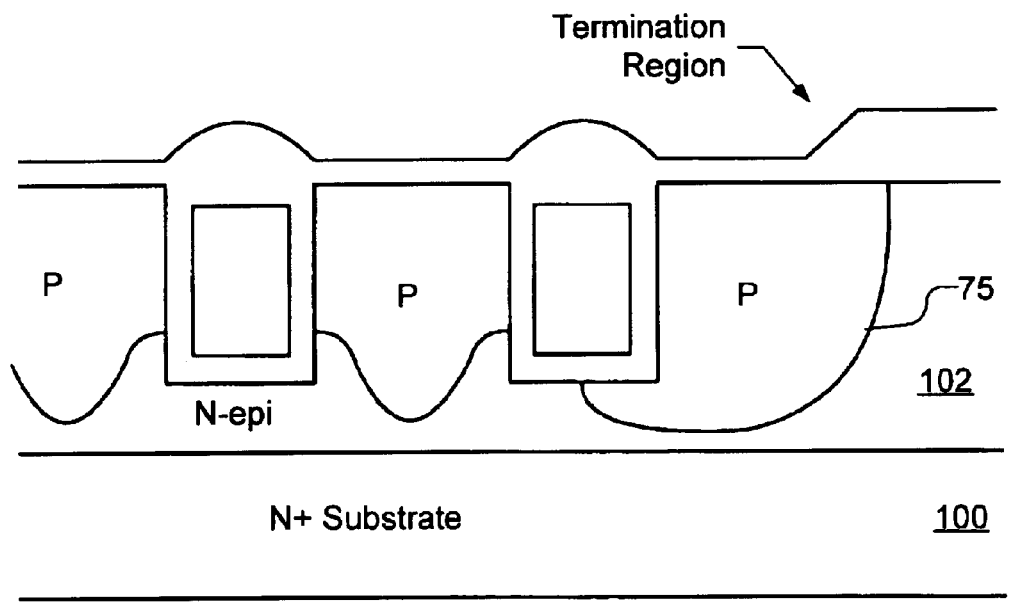

7. As shown in FIG. 19A, there is no need for a separate P-type diffusion in the termination region of the MOSFET, since P-epi layer 102 extends to N+ substrate 100 except where the N drain-drift regions 116 are located. FIG. 19B shows the termination region of a conventional MOSFET which includes a P-type diffusion 75. The elimination of the P-type termination diffusion or field ring reduces the number of masking steps. For example, in the process described herein only five masking steps are required.

Formation of Drain-drift Region

Figure 12A:
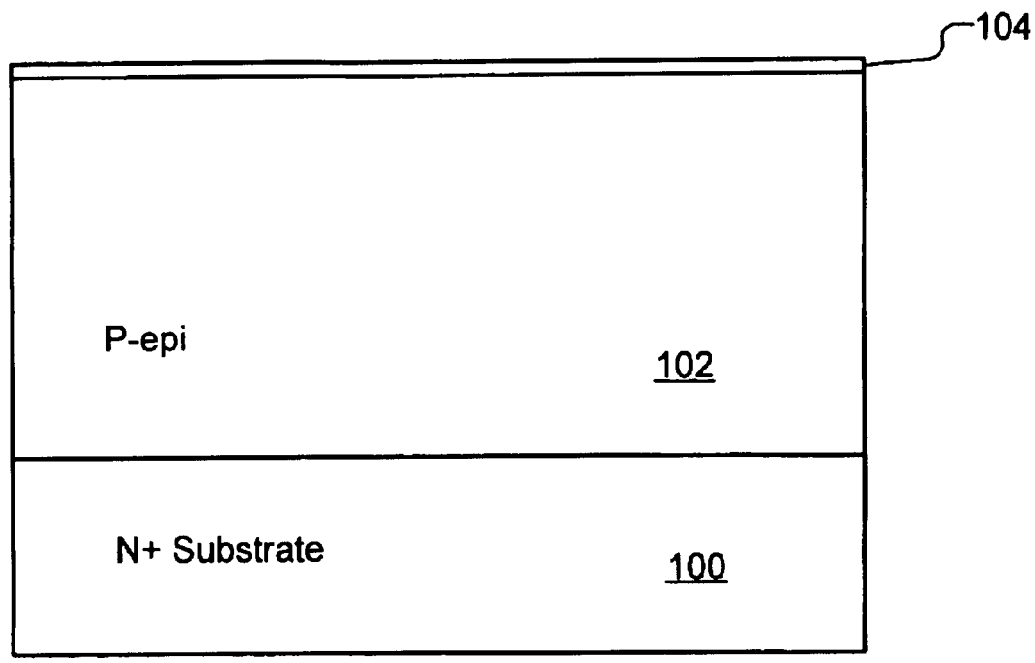
FIGS. 12A–12G illustrate a process of forming a drain-drift region by implanting dopant between trench sidewall spacers and through the bottom of the trench.
Figure 12B:
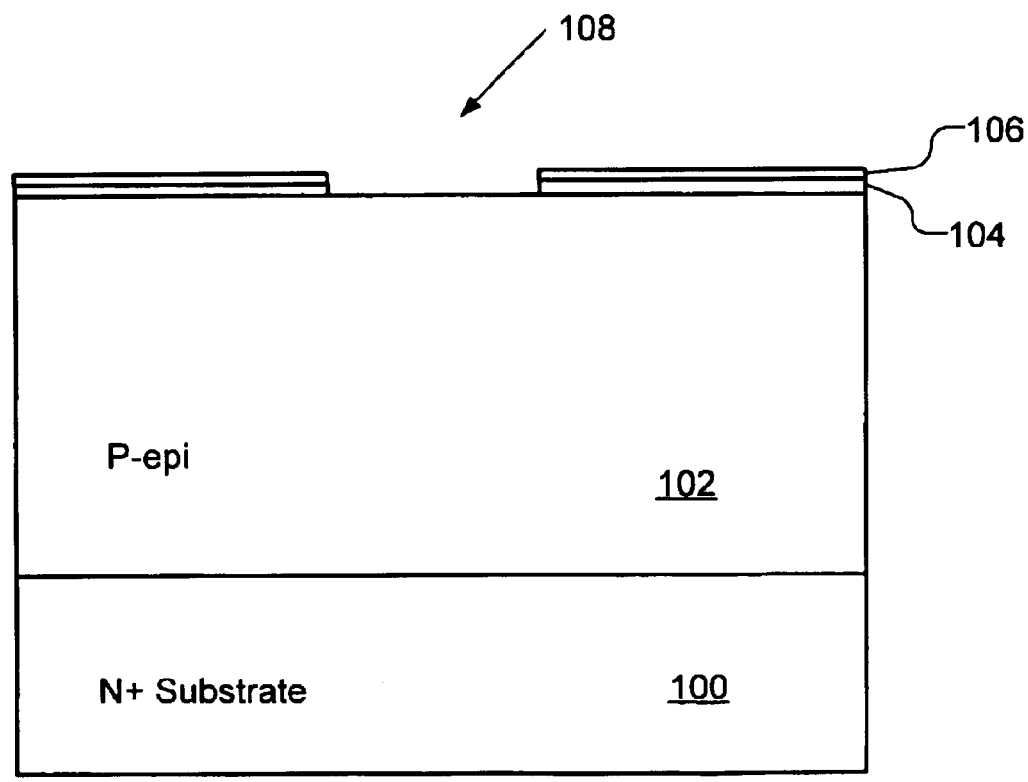
Figure 12C:
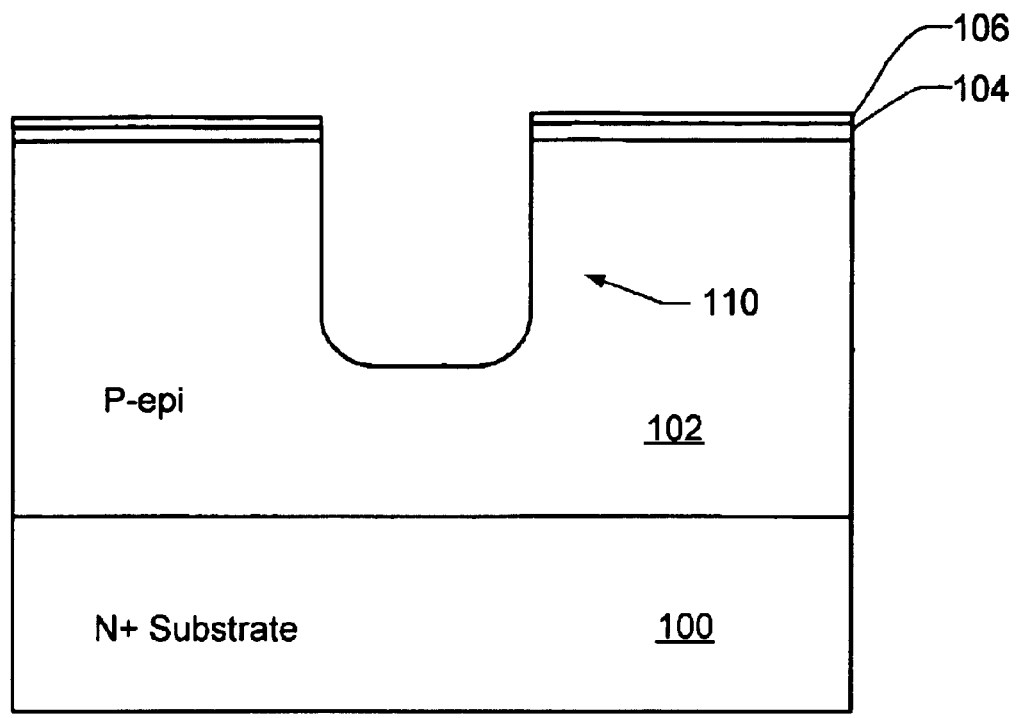
Figure 12D:
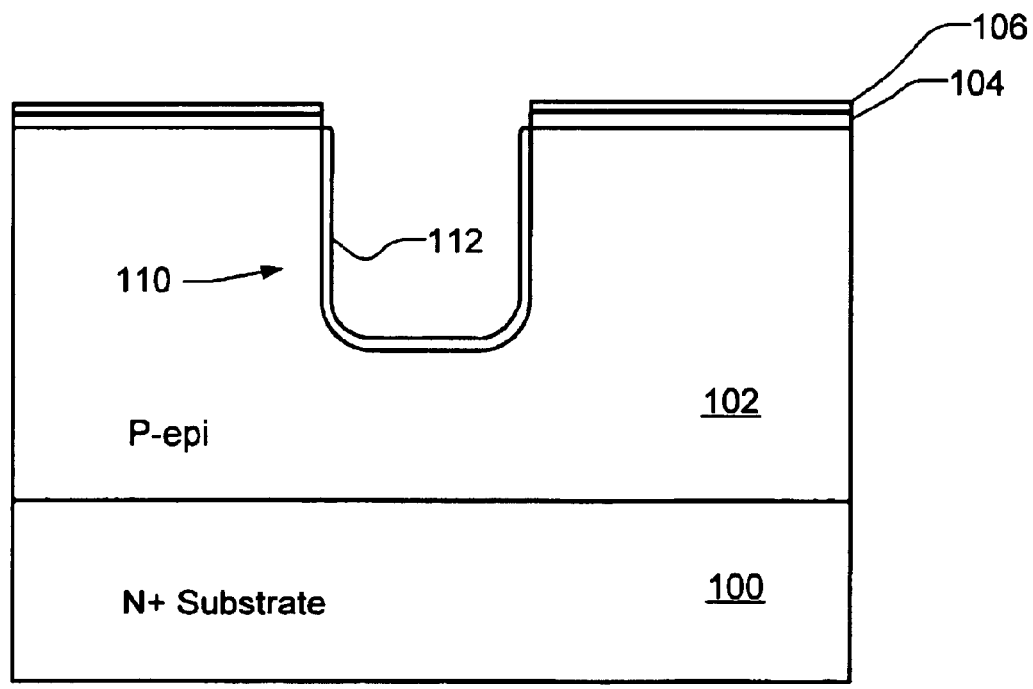
Figure 12E:
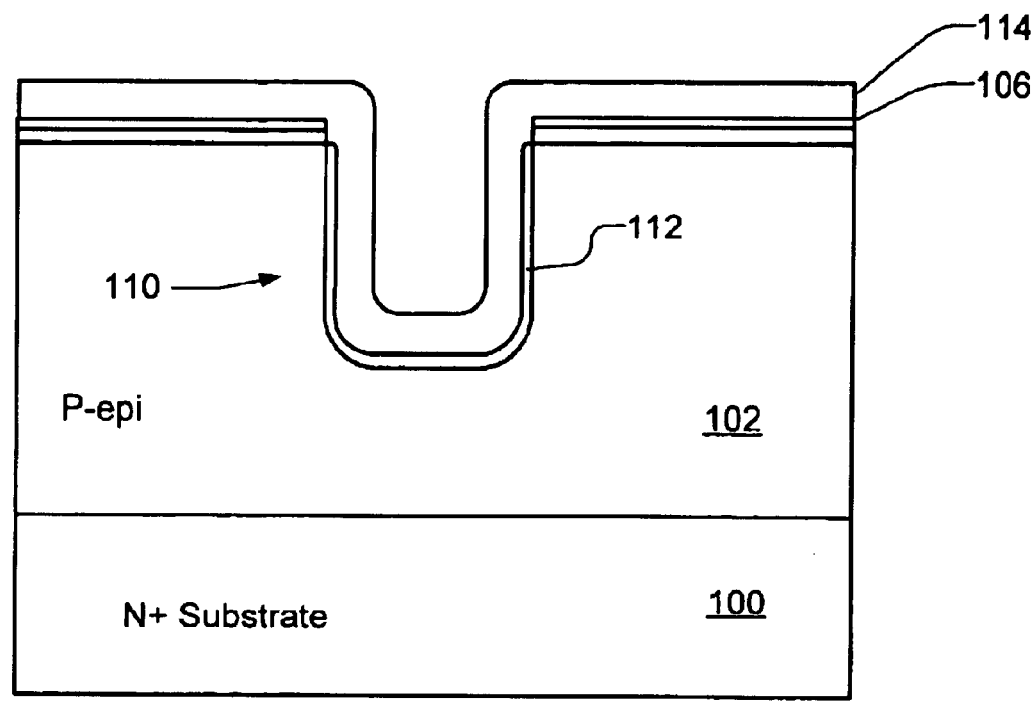
Figure 12F:
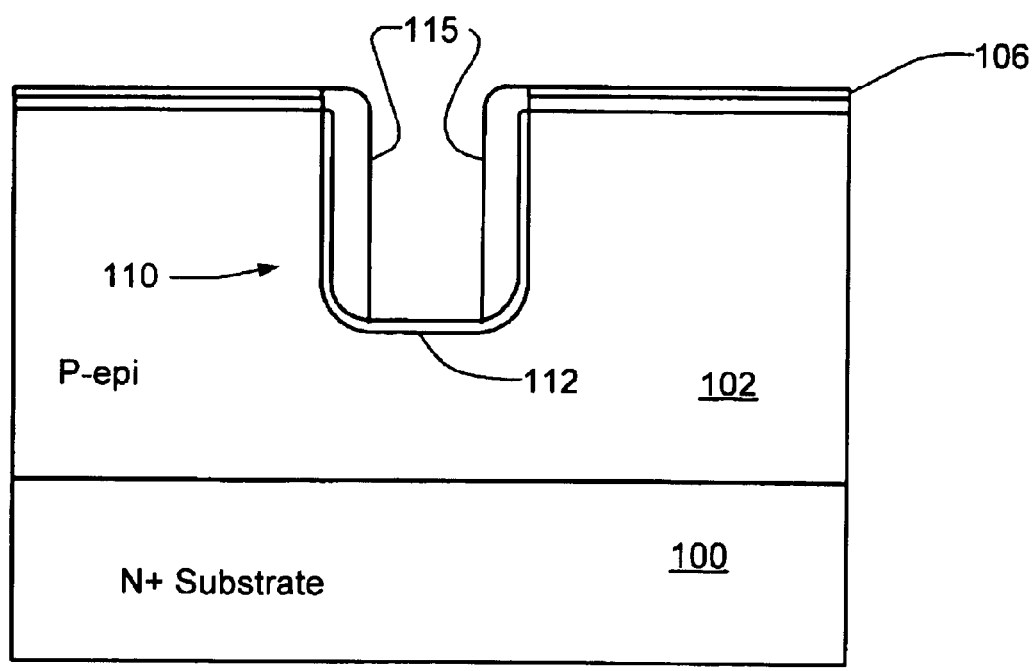
Figure 12G:
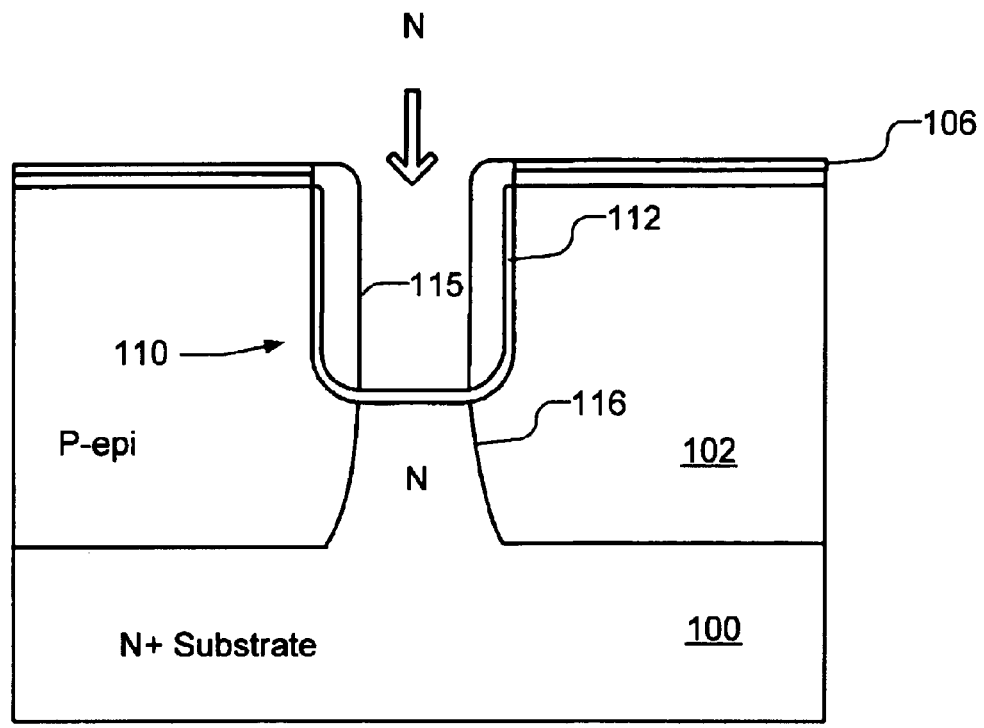
Figure 12H:
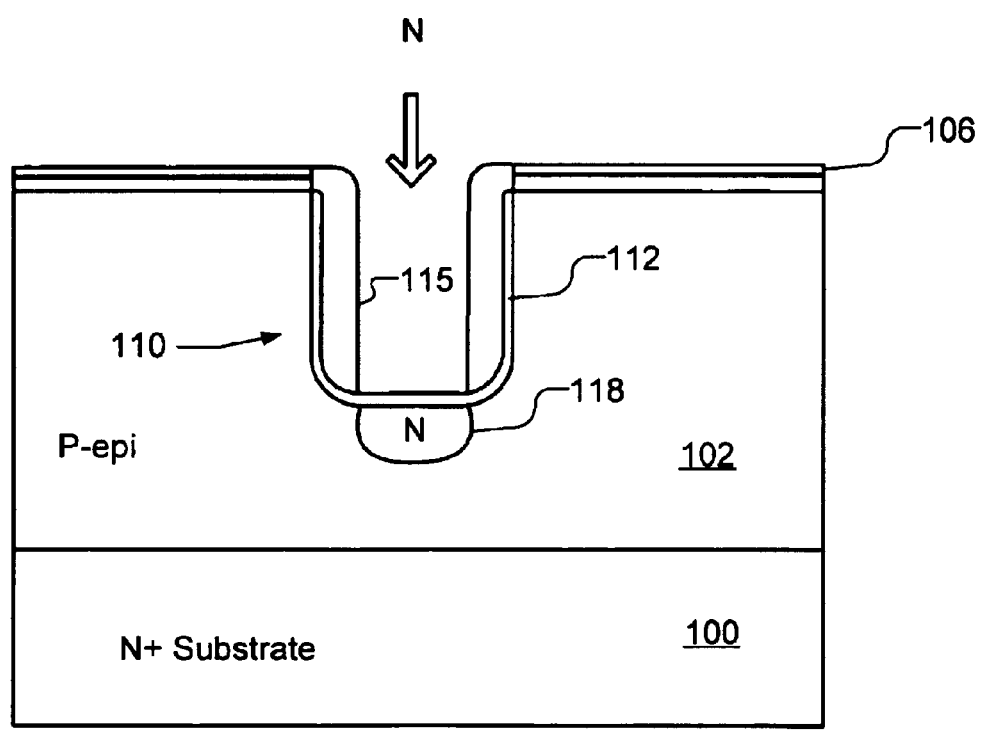
FIGS. 12H and 12I illustrate a process of forming a drain-drift region by implanting dopant between trench sidewall spacers into a region immediately below the bottom of the trench and diffusing it downward to the substrate.
Figure 12I:
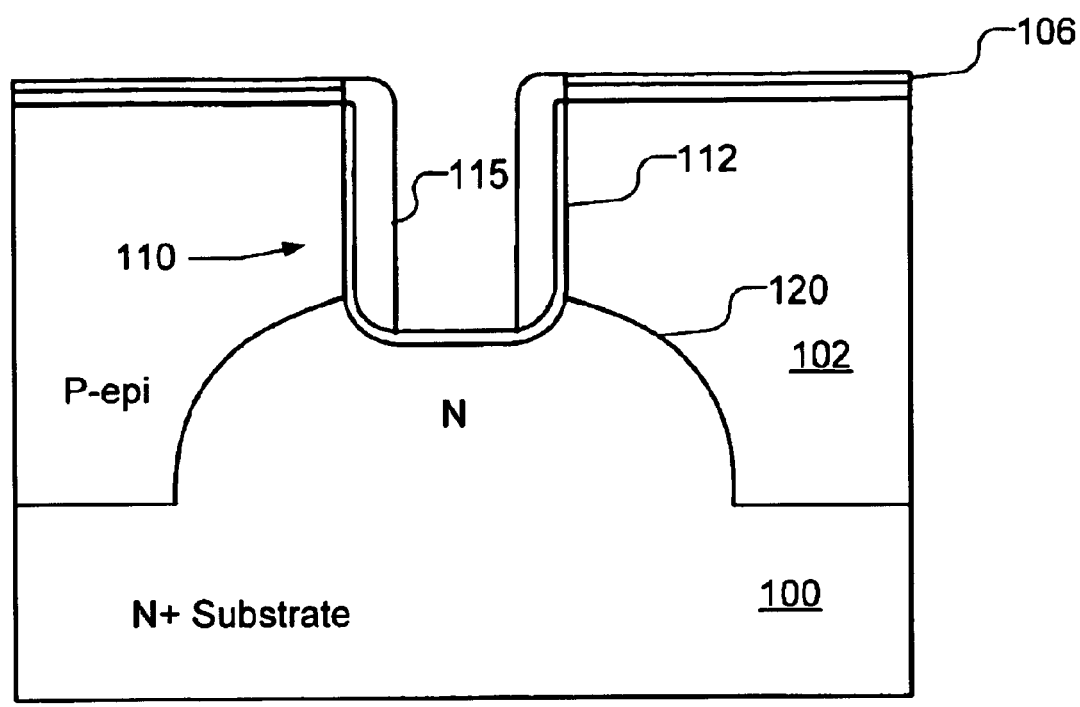
Figure 12J:
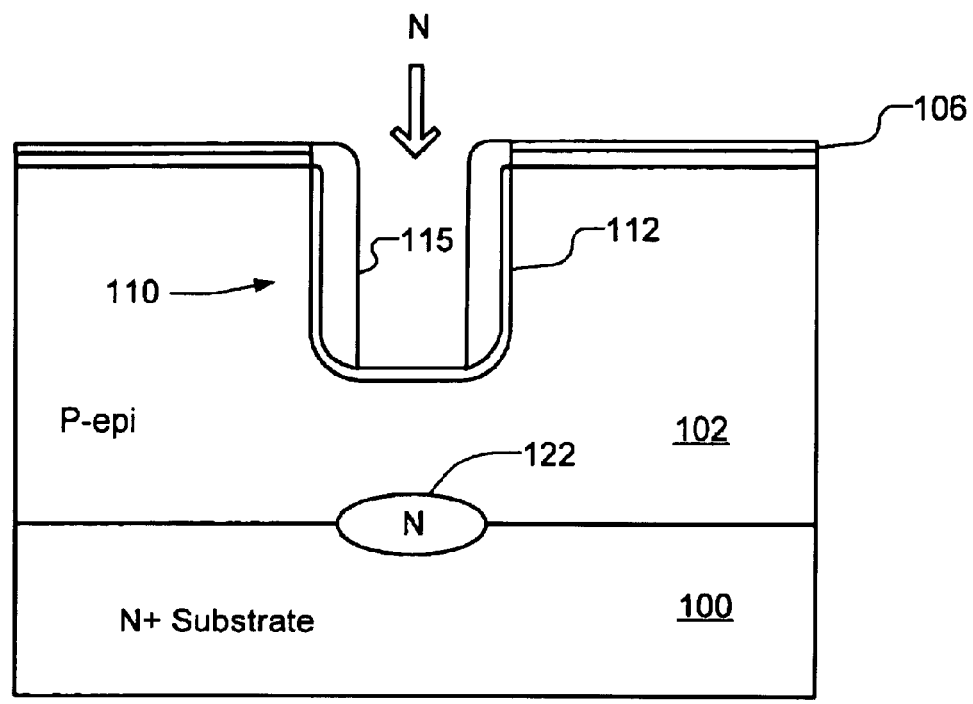
FIGS. 12J and 12K illustrate a process of forming a drain-drift region by implanting a deep layer of dopant below the trench and diffusing the dopant upward to the trench.
Figure 12K:
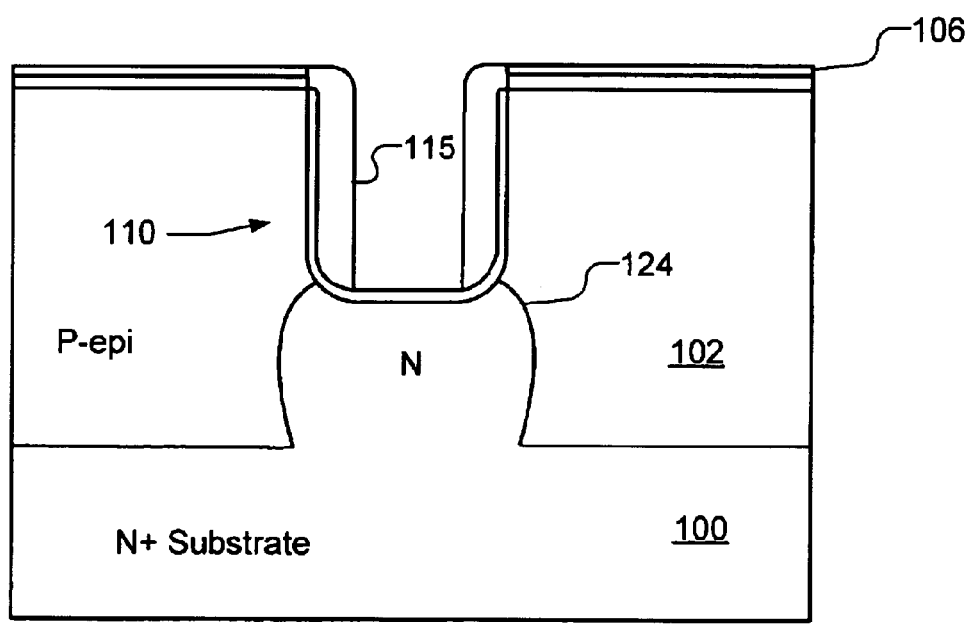
Figure 12L:
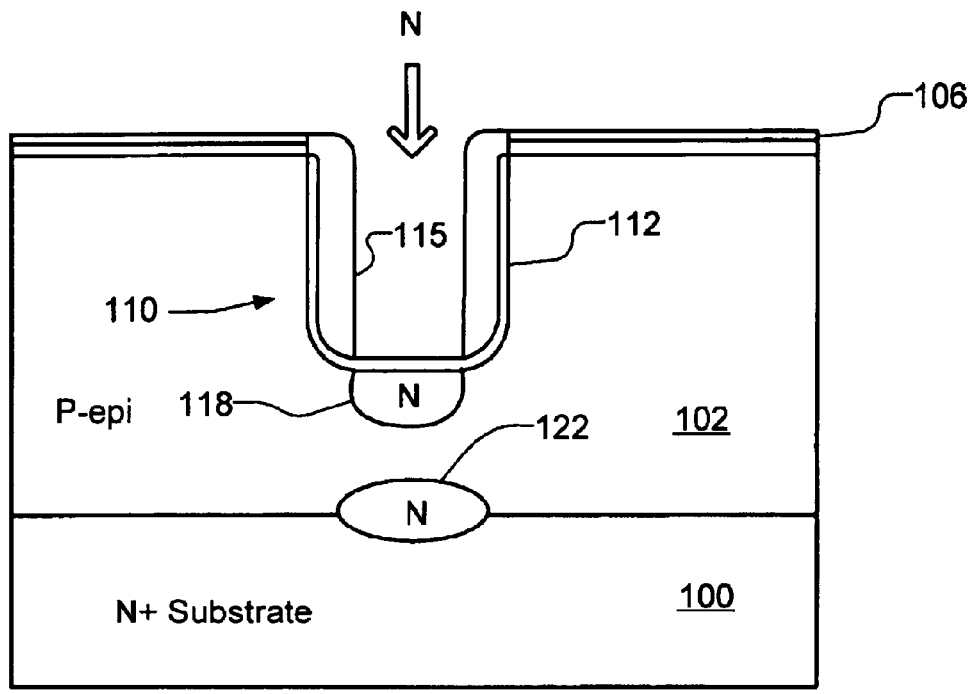
FIGS. 12L and 12M illustrate a process of forming a drain-drift region by implanting dopant between trench sidewall spacers to form both a relatively shallow region immediately below the bottom of the trench and a deep layer below the trench and then diffusing the dopant until the shallow region and the deep layer merge.
Figure 12M:
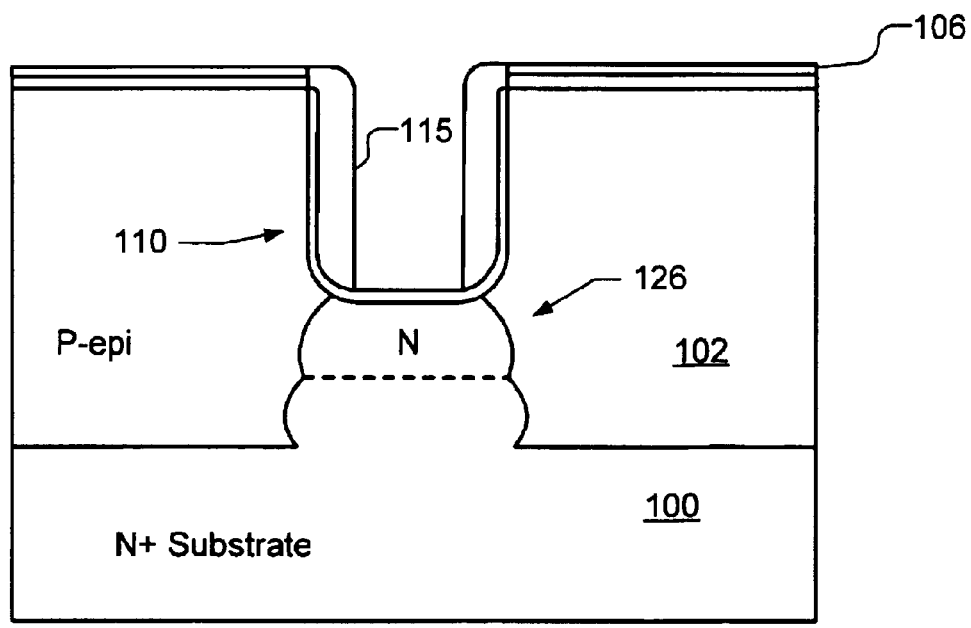
Figure 12N:
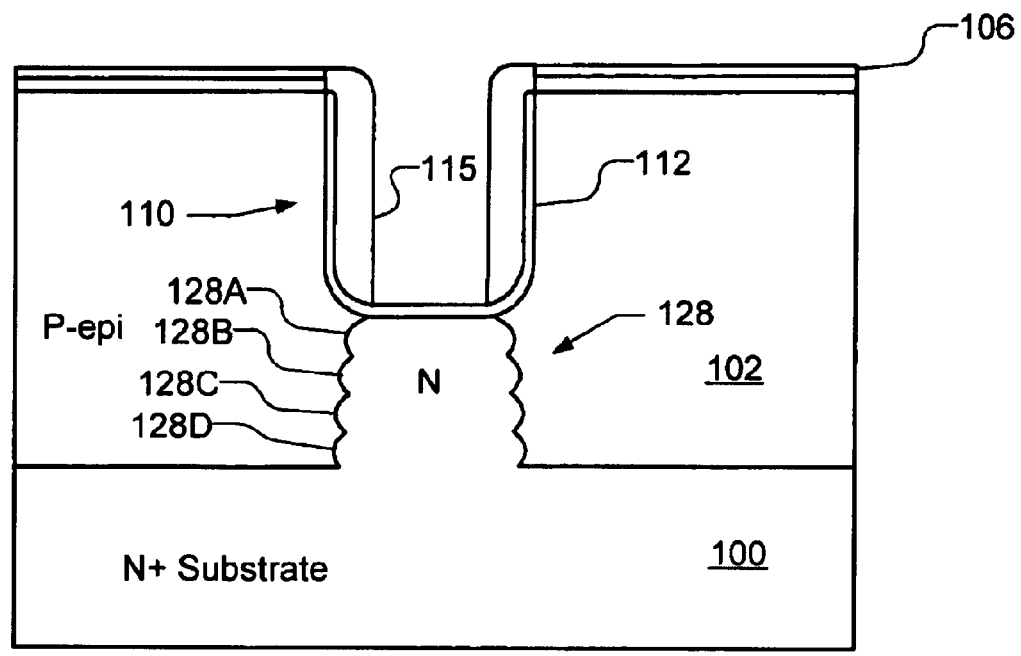
FIG. 12N illustrates a process of forming a drain-drift region by performing a series of implants at different energies between trench sidewall spacers and through the bottom of the trench to form a stack of regions.

FIGS. 12A–12N are cross-sectional views illustrating one embodiment of a process for fabricating a trench MOSFET, such as MOSFET 70 of FIG. 5A, in accordance with the present invention. As shown in FIG. 12A, the process begins with a lightly-doped P-epi layer 102 (typically about 6 to 8 μm thick) grown on a heavily doped N⁺ substrate 100. A pad oxide 104 (e.g., 100–200 Å thick) is thermally grown by dry oxidation at 950° C. for 10 minutes on P-epi layer 102. As shown in FIG. 12B, a nitride layer 106 (e.g., 200–300 Å thick) is deposited by chemical vapor deposition (CVD) on pad oxide 104. Using a normal photolithographic process and a first (trench) mask, nitride layer 106 and pad oxide 104 are patterned to form an opening 108 where a trench is to be located. As shown in FIG. 12C, a trench 110 is etched through opening 108, typically using a dry plasma etch, for example, a reactive ion etch (RIE). Trench 110 may be about 0.5–1.2 μm wide and about 1–2 μm deep.

A second pad oxide 112 (e.g., 100–200 Å) is thermally grown on the sidewall and bottom of trench 110, as shown in FIG. 12D. A thick nitride layer 14 (e.g., 1000–2000 Å) is deposited conformally by CVD on the sidewall and bottom of trench 110 as well as on top of nitride layer 106, as shown in FIG. 12E. Nitride layer 114 is etched using a directional, dry plasma etch, such as an RIE, using an etchant that has a high selectivity for nitride layer 114 over oxide. The nitride etch leaves spacers 115 of nitride layer 114 along the sidewalls of trench 110, while exposing pad oxide 112 at the central bottom portion of trench 110, as shown in FIG. 12F. It is possible that nitride layer 114 may be overetched to such a degree that nitride layer 106 is removed from the top of pad oxide 104.

Leaving sidewall spacers 115 in place, an N-type dopant is implanted through the pad oxide 112 at the bottom of trench 110 to produce N drain-drift region 116 (FIG. 12G). For example, phosphorus can be implanted at a dose of $1\times10^{13}$ cm$^{-2}$ to $1\times10^{14}$ cm$^{-2}$ and an energy of 300 keV to 3.0 MeV. To avoid significant diffusion of the phosphorus and the consequent expansion of N drain-drift region 116, the thermal budget to which the structure is thereafter exposed is limited to the equivalent of about 950° C. for 60 minutes, or the structure can be subjected to a rapid thermal anneal (RTA) at 1050° C. for 90 seconds. In either case, N drain-drift region 116 retains essentially the compact shape shown in FIG. 12G. Advantageously, in the cross-sectional view of FIG. 12G, at least 75% and preferably 90% of the N drain-drift region 116 is located directly below the trench 110.

Alternatively, N drain-drift region 116 can be formed by implanting the phosphorus at a lower energy of 30 keV to 300 keV (typically 150 keV) to form an N-type region 118 immediately below the trench (FIG. 12H), and then diffusing the phosphorus by heating at 1050° C. to 1150° C. for 10 minutes to 120 minutes (typically 1100° C. for 90 minutes), so that N-type region 118 expands downward and laterally to form a drain-drift region 120 having a shape of the kind shown in FIG. 12I.

In another variant of the process, a deep layer 122 (e.g., phosphorus) is implanted at a relatively high energy to a location below the trench, as shown in FIG. 12J, and a thermal process is used to up-diffuse the phosphorus until it reaches the bottom of the trench, yielding a drain-drift region 124, as shown in FIG. 12K. This is distinguishable from the process described above in conjunction with FIG. 12G, where after the implant the N-type dopant extends from the bottom of trench 110 to the 10 interface between the N+ substrate and the P-epi layer, or in conjunction with FIG. 12H, where after the implant the dopant lies just below the bottom of the trench. When the N-type dopant is implanted at a relatively high energy to form deep layer 122, variations in the depth of the trench, the thickness of the P-epi layer 102, and the implant energy may cause layer 122 to be located either above the interface between N+ substrate 100 and P-epi layer 102 (e.g., if P-epi layer 102 is thick and/or the trench depth is small) or in N+ substrate 100 (e.g., if P-epi layer 102is thin and/or the trench depth is large).

Figure 11:
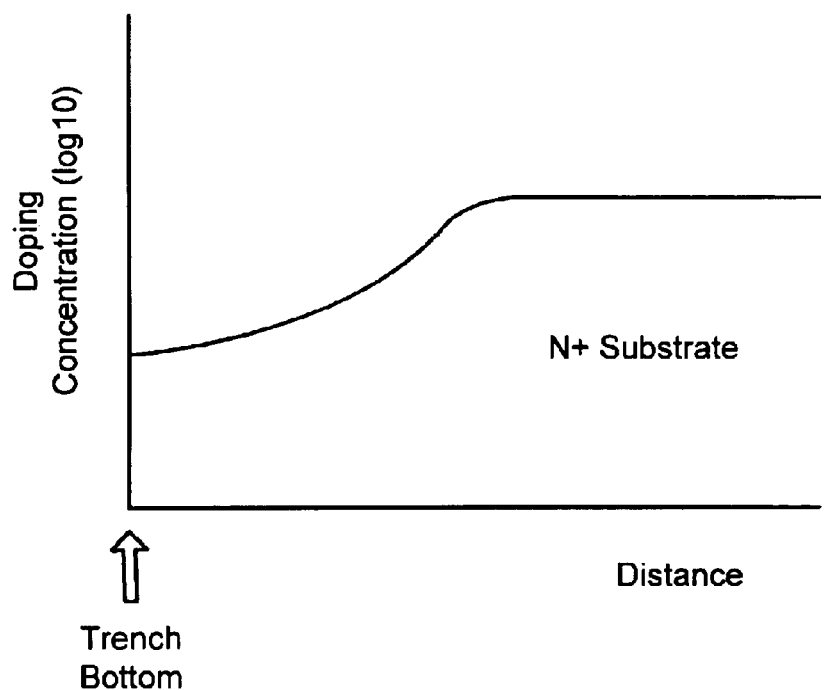
FIG. 11 shows the general shape of the doping profile in a vertical cross-section below the trench when the drain-drift region is formed by implanting a deep layer and up-diffusing the deep layer.

FIG. 11 shows the general shape of the doping profile in a vertical cross-section starting at the bottom of the trench when the drain-drift region is formed by up-diffusing a deep implanted layer. As indicated, the concentration of N-type dopant in the drain-drift region increases monotonically with increasing distance below the bottom of the trench. This is distinguishable from the doping profile below the trench in a MOSFET formed using the low-energy process, as shown in FIG. 5B, where the doping concentration initially decreases and then increases in the vicinity of the N+ substrate.

Using the process illustrated in FIGS. 12J and 12K provides an N drain-drift region that is confined largely to the area directly below the trench and allows a smaller cell pitch. The process is also easier to control and provides greater throughput.

Alternatively, a combination up-diffusion, down-diffusion process can be used to form the drain-drift region. As shown in FIG. 12L, deep N layer 122 (e.g., phosphorus) is formed at the interface of N+ substrate 102 and P epi layer 100 by a high-energy implant process. As described above in connection with FIG. 12H, an N-type dopant is implanted through the bottom of the trench to form N+ region 118 beneath the trench. The structure is then heated, for example, to 900 to 1100° C. Deep N layer 122 diffuses upward and N region 118 diffuses downward until they merge, forming N-type drain-drift region 126, as shown in FIG. 12M.

Yet another alternative is to form the drain-drift region with a series of three or more N implants at successively greater energies to form a stack of overlapping implanted regions 128 as shown in FIG. 12N. The stack 128 includes four implanted regions 128A–128D, but fewer or more than four implants could also be used to form the stack. The stack could be formed with essentially no diffusions (i.e., no heating), or it could be heated to diffuse the dopant and increase the amount of overlap between the regions 128A–128D.

Figure 12O:
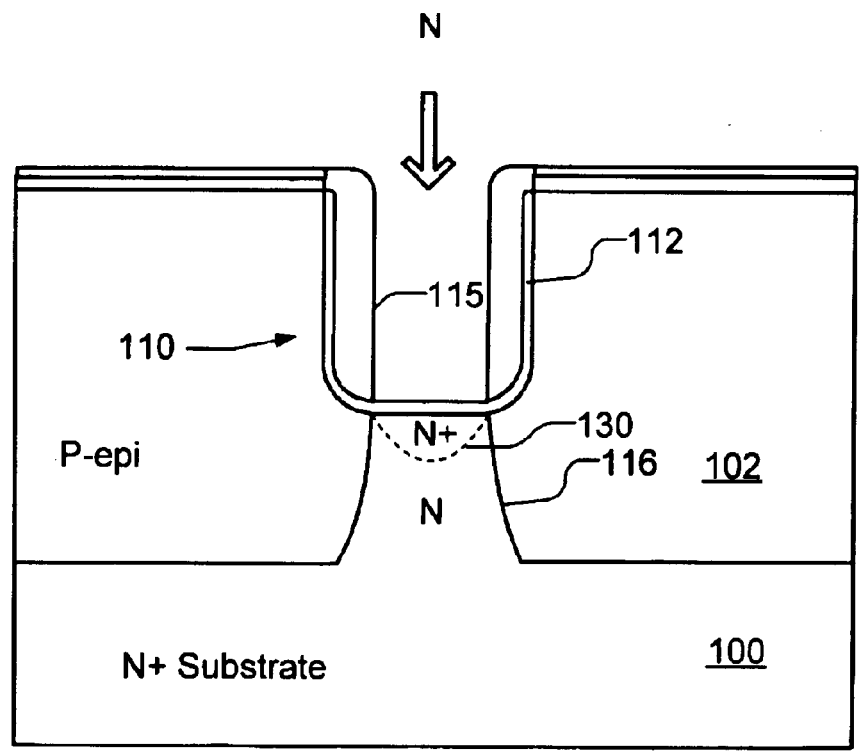
FIG. 12O shows an embodiment with a heavily-doped region implanted in the drain-drift region.

Optionally, to increase current spreading in the drain-drift region and further reduce the on-resistance of the device, a heavily-doped N+ region 130 can be implanted in the drain-drift region 116, as shown in FIG. 12O.

At the conclusion of the process, whether high energy or low energy, the N drain-drift region extends from the N+ substrate to the bottom of the trench. In many cases, the junction between the N drain-drift region and the P-epi layer extends from the substrate to a sidewall of the trench. If the low energy implant process is used and the dopant is later thermally diffused, the junction between the drain-drift region and the P-epi layer takes the form of an arc that is concave towards the interior of drain-drift region (FIG. 12I).

Any of the methods described above may be used to form the drain-drift region. In the following explanation of how a thick bottom insulating layer is formed, it will be assumed that the implant process represented by FIG. 12G is used. It should be understood, however, that any of the alternative methods could be used as well.

Formation of Thick Bottom Oxide

Figure 13A:
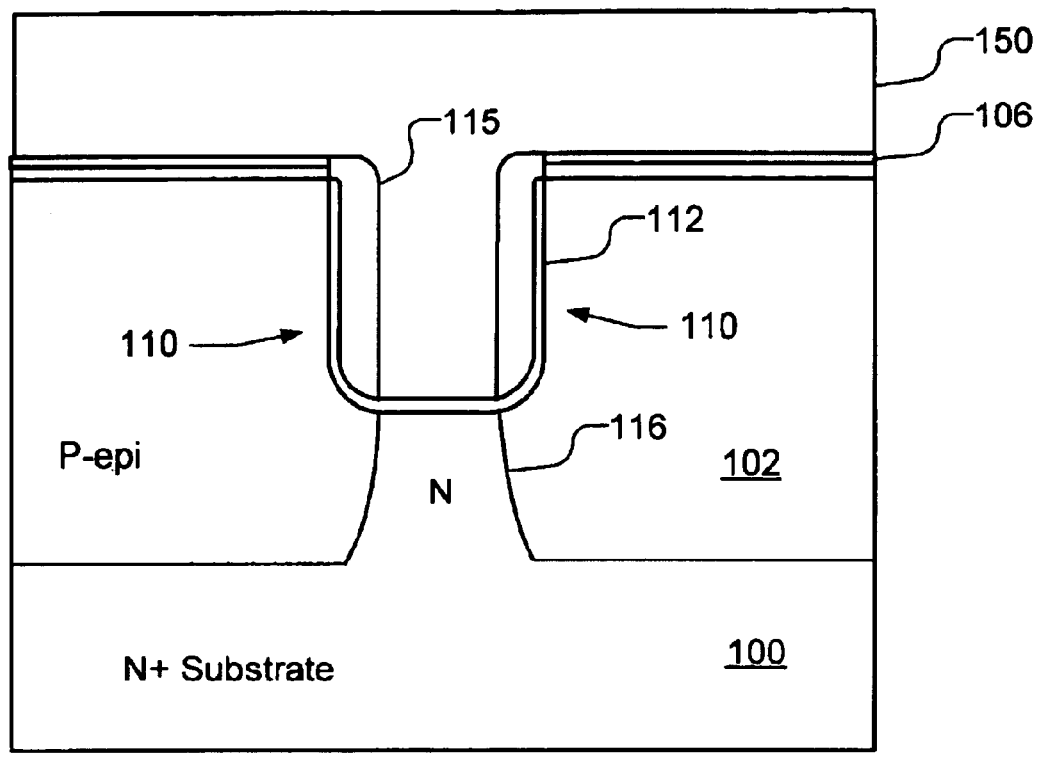
FIGS. 13A–13C illustrate a process of forming a thick bottom oxide layer by depositing an oxide between the trench sidewall spacers.

The process begins, as shown in FIG. 13A, with the deposition of a thick insulating layer 150, which may be 2–4 μm thick, for example. The deposition process is chosen to be non-conformal, filling trench 110 and overflowing onto the top surface of P-epi layer 102. Thick insulating layer 150 may be, for example, a low temperature oxide (LTO), a chemical vapor deposition (CVD) oxide, a phosphosilicate glass (PSG), a borophosphosilicate glass (BPSG), or another insulating material. In the following description, insulating layer 150 is assumed to be a CVD oxide layer.

Figure 13B:
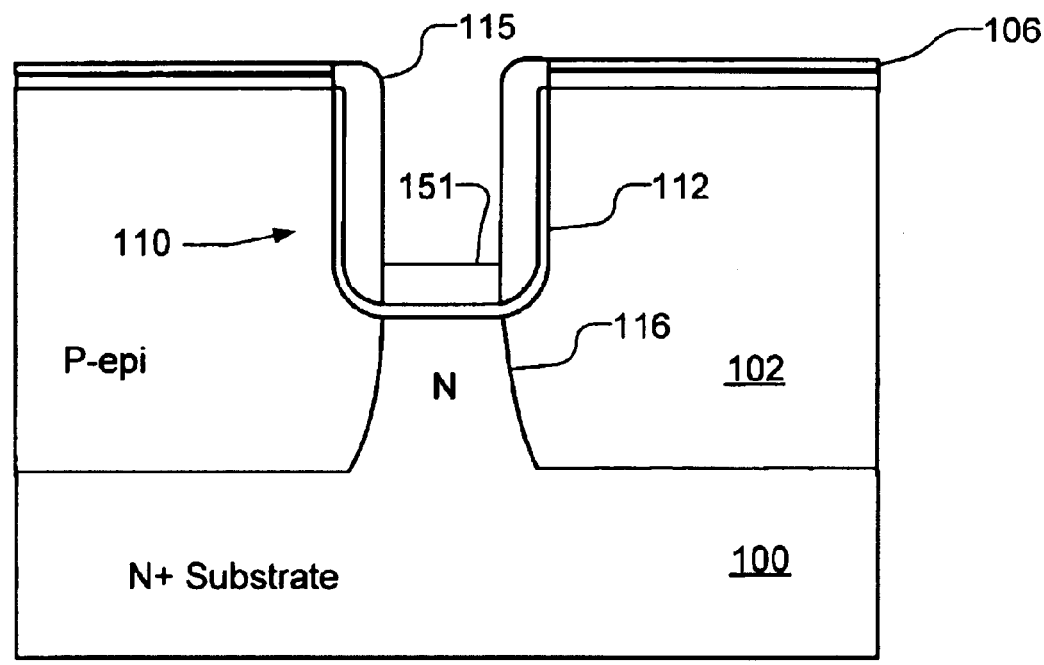

Oxide layer 150 is etched back into trench 110, typically by performing a wet etch with an etchant that has high selectivity for oxide over nitride. Oxide layer 150 is etched until only about 0.1–0.2 μm remains in trench 110, as shown in FIG. 13B forming a thick bottom oxide layer 151.

Figure 13C:
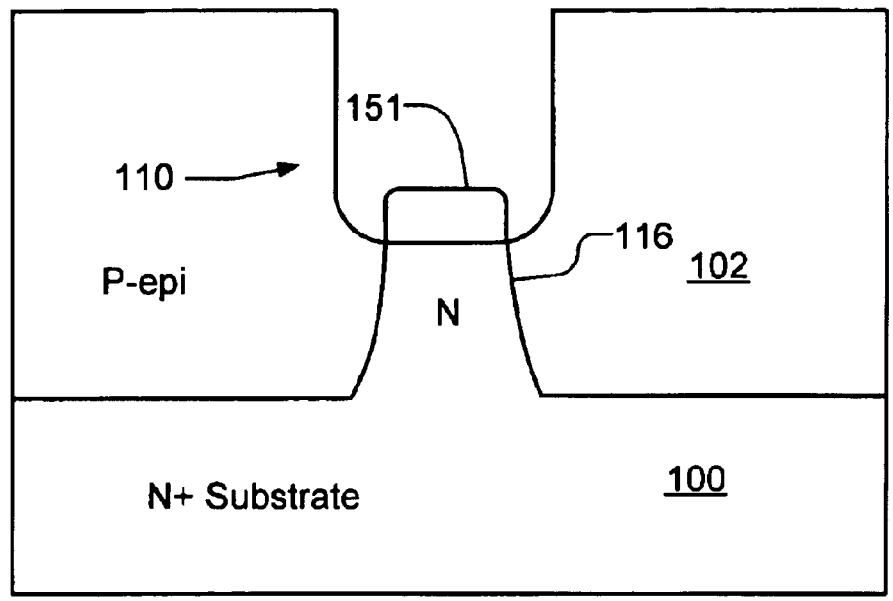

Nitride layer 106 and spacers 115 are removed, typically by performing a wet etch with an etchant that has high selectivity for nitride over oxide is. Pad oxide 104 and the, exposed portion of pad oxide 112, typically by a wet etch. This wet etch removes a small but insignificant portion of thick oxide layer 151. The resulting structure is shown in FIG. 13C, with thick oxide layer 151 remaining at the bottom of trench 110.

In another variation according to this invention, a gradual transition is formed between between the thick and thin sections of the gate oxide layer.

The process may be identical to that described above through the step illustrated in FIG. 12F, where the nitride etch leaves sidewall spacers 115 along the sidewalls of trench 110, while exposing pad oxide 112 in the central bottom portion of trench 110. In the next step, however, instead of depositing a thick insulating layer, a thick oxide layer is grown by a thermal process. When this is done, the thermal oxide consumes part of the silicon and thereby undercuts the edges of sidewall spacers 115, causing the nitride to "lift off" of the surface of the trench. This forms a structure that is similar to the "bird's beak" in a conventional LOCOS (LOCal Oxidation of Silicon) process that is often used to create field oxide regions on the top surface of a semiconductor device.

Figure 14:
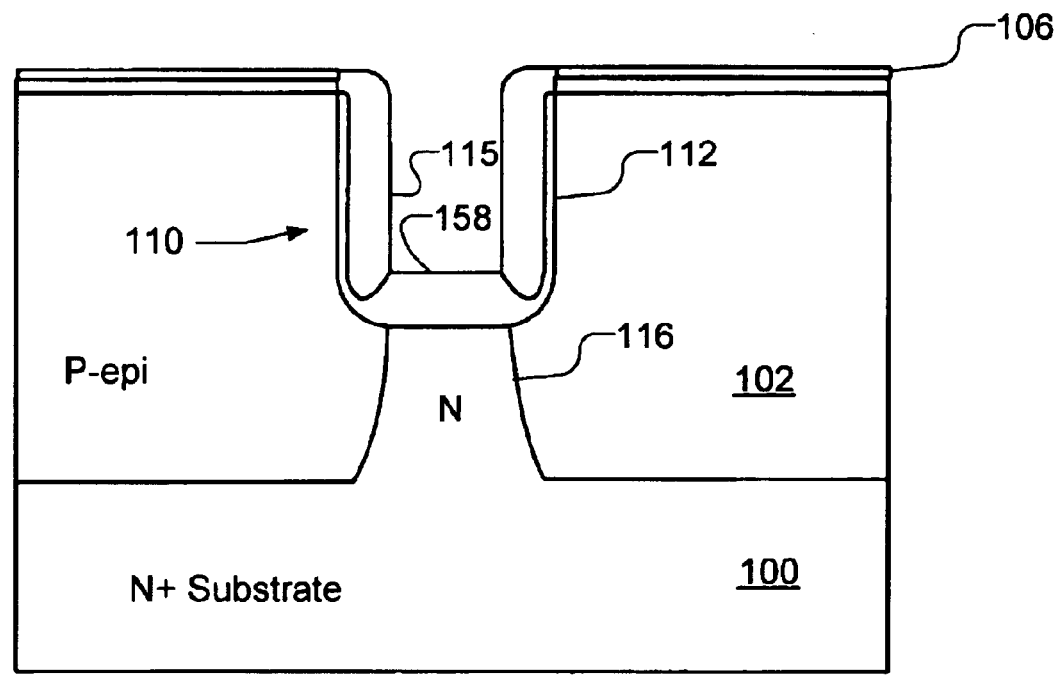
FIG. 14 illustrates a process of forming a thick bottom oxide layer by thermally growing an oxide between the trench sidewall spacers.

FIG. 14 shows the structure after a thermal oxide layer 158 has been grown at the bottom of trench 110. The structure is shown in detail in FIG. 15A. The edges of thermal oxide layer 158 have pushed under sidewall spacers 115 and as a result become sloped or tapered.

Figure 15A:
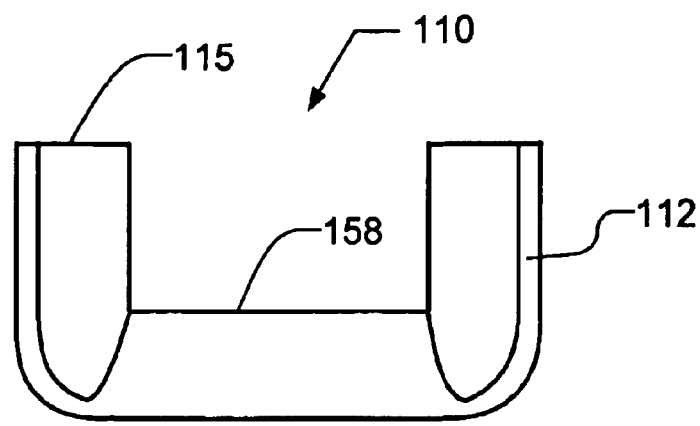
FIGS. 15A–15C illustrate the process of FIG. 14 with sidewall spacers of various thicknesses.
Figure 15B:
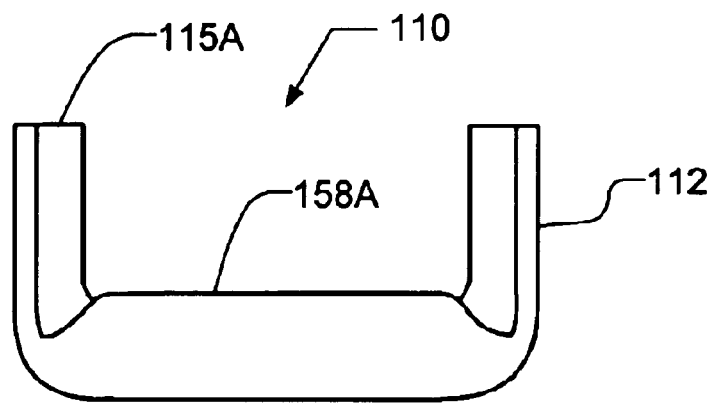
Figure 15C:
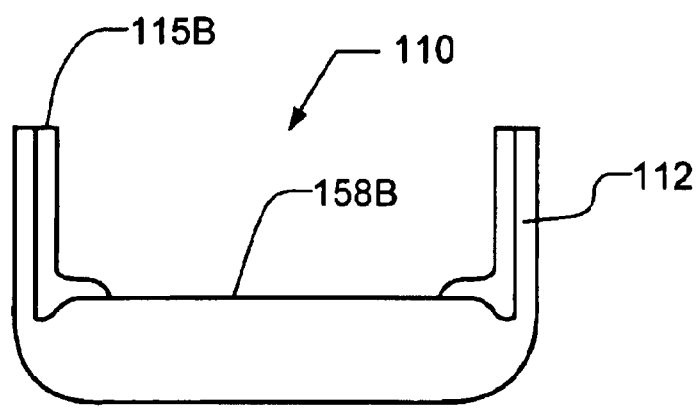

Altering the thickness of the sidewall spacers allows one to position the edges of the oxide layer at different locations. FIG. 15A shows relatively thick sidewall spacers 115, and as a result the edges of oxide layer 158 are located on the bottom of trench 110. FIG. 15B shows thinner sidewall spacers 115A, with the edges of oxide layer 158A located essentially at the corners of trench 110. FIG. 15C shows even thinner sidewall spacers 115B, with the edges of oxide layer 158B located on the sidewalls of trench 110.

In a similar manner, the edges of the oxide layer may be positioned at various intermediate points by altering the thickness of the sidewall spacers. The thickness of the sidewall spacers is independent of the width or depth of trench. For example, if the sidewall spacers are in the range of 1,500 to 2,000 Å thick, the edges of the oxide layer would most likely be located on the bottom of the trench (FIG. 15A). If the sidewall spacers are 500 Å or less thick, the edges of the oxide layer would typically be located on the sidewalls of trench (FIG. 15C).

The oxide layer may be grown, for example, by heating the silicon structure at a temperature from 1,000° C. to 1,200° C. for 20 minutes to one hour.

Figure 16A:
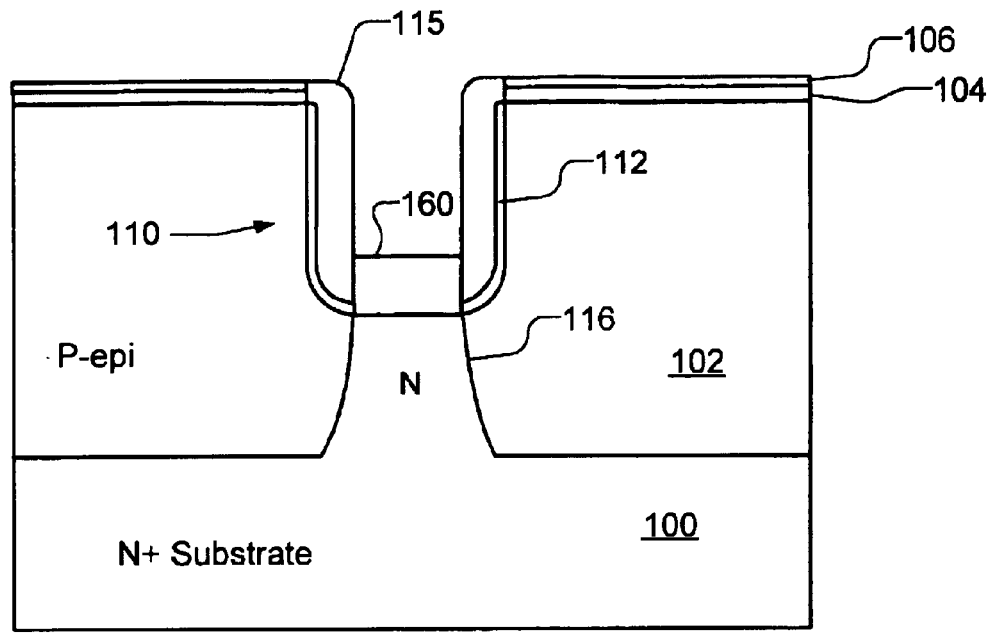
FIGS. 16A and 16B illustrate a process of forming a thick bottom oxide layer by utilizing the differential deposition rates of oxide on various materials.
Figure 16B:
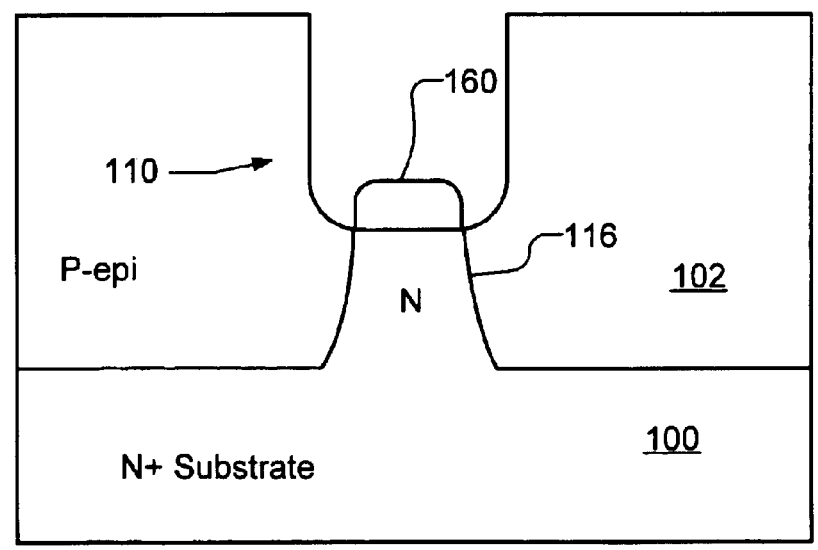

Yet another way of forming a thick bottom oxide is illustrated in FIGS. 16A and 16B. After drain-drift region 116 and sidewall spacers 115 have been formed, as described above and shown in FIGS. 12A–12G, an oxide layer 160 is deposited by a process that causes it to deposit selectively on the silicon exposed in the bottom of trench 110 rather than on the sidewall spacers 115. One process that may be used is a subatmospheric chemical vapor deposition (SACVD) process, using ozone to drive the chemical reaction. During the reaction, the ozone readily dissociates to release atomic oxygen, which combines with a precursor such as TEOS to form silicon dioxide. The structure may then be annealed.

Table 1 illustrates exemplary process parameters for ozone-activated TEOS SACVD formation of thick insulating layer 21.

TABLE 1

| | |
|---|---|
| Temperature | 400° C. |
| Pressure | 600 Torr |
| Ozone flow rate | 5000 sccm |
| Helium flow rate | 4000 sccm |
| TEOS flow rate | 325 mgm |
| GDP-to-wafer spacing | 250 mm |

Spacers 115 may include materials other than nitride. The material used for the spacers is selected such that silicon dioxide preferentially deposits on silicon over the spacers. The selection of the material for the spacers depends on the oxide deposition process used. Table 2 illustrates the deposition selectivity of several materials during ozone-activated TEOS SACVD.

TABLE 2

| Material | Deposition Selectivity |
|---|---|
| Si: Nitride | 5:1 |
| Si: Thermal Oxide | 3:1 |
| Si: TEOS PECVD Oxide | 2:1 |
| Si: SiH$_4$ PECVD Oxide | 1:1 |
| Si: PECVD BPSG | 1:1 |

As shown in Table 2, during ozone-activated TEOS SACVD, silicon dioxide deposits on silicon five times faster than it deposits on nitride. Thus, during fabrication of a device using nitride sidewall spacers 115, the silicon dioxide deposited in the bottom of trench 110 would be about five times thicker than any silicon dioxide deposited on the nitride sidewall spacers 115. In fact, for 3000 Å of oxide film growth on the silicon surface, no oxide growth was observed on the nitride surface. The deposition selectivity is possibly due to the lower surface energy of silicon nitride compared to silicon. As illustrated in Table 2, thermally grown silicon dioxide or TEOS PECVD deposited silicon dioxide may also make a suitable material for the spacers when the deposition of layer 160 is ozone-activated TEOS SACVD, since silicon dioxide will also preferentially deposit on silicon over these materials. SiH$_4$ PECVD deposited silicon dioxide or PECVD deposited BPSG would not make suitable spacer materials for ozone-activated TEOS SACVD, since silicon dioxide does not prefer silicon to these materials. If a deposition process besides ozone-activated TEOS SACVD is used, materials other than those shown in Table 2 may be used for the side wall spacers.

After oxide layer 160 has been deposited, a buffered oxide etch is used to remove any oxide that deposited on the surfaces of nitride sidewall spacers 115, and a wet nitride etch is used to remove nitride sidewall spacers 115 and nitride layer 106. To ensure that all of the nitride is removed, another anneal may be performed, for example, at 1,000° C. for 5–10 minutes to oxidize any remaining nitride, and the anneal may be followed by an oxide etch. The oxide etch removes any oxidized nitride but does not remove significant portions of oxide layer 160.

Pad oxides 104 112 are also removed, typically by a wet etch. This wet etch removes a small but insignificant portion of oxide layer 160. The resulting structure is shown in FIG. 16B, with a portion of oxide layer 160 left remaining at the bottom of trench 110.

Completion of Device

After the thick bottom oxide has been formed by one of the foregoing processes, a sacrificial oxide layer (not shown) can be grown in the sidewalls of the trench and removed. This aids in removing any crystal damage caused during the etching of the trench. The sacrificial oxide layer can be approximately 500 Å thick and can be thermally grown, for example, by dry oxidation at 1050° C. for 20 minutes, and removed by a wet etch. The wet etch of the sacrificial gate oxide is kept short to minimize etching of oxide layer at the bottom of the trench.

Figure 17A:
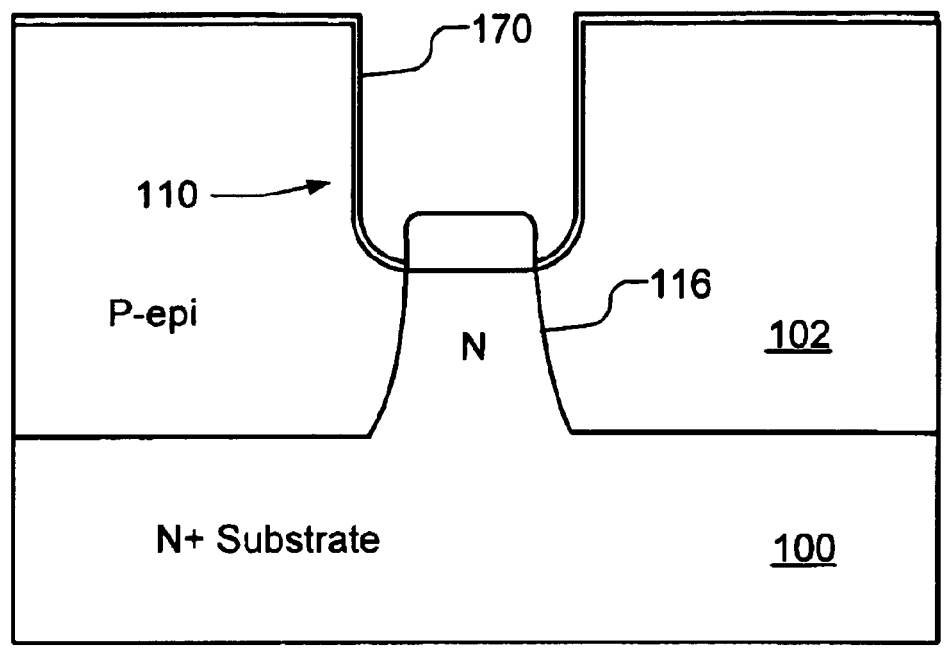
FIGS. 17A–17I illustrate a process for continuing the fabrication of an MIS device after the thick bottom oxide layer has been formed.

Next, as shown in FIG. 17A, a gate oxide layer 170 or other insulating layer (e.g., about 300–1000 Å thick) is formed on the sidewall of trench 110 and the top surface of P-epi layer 102. For example, gate oxide layer 170 may be thermally grown using a dry oxidation at 1050° C. for 20 minutes.

Figure 17B:
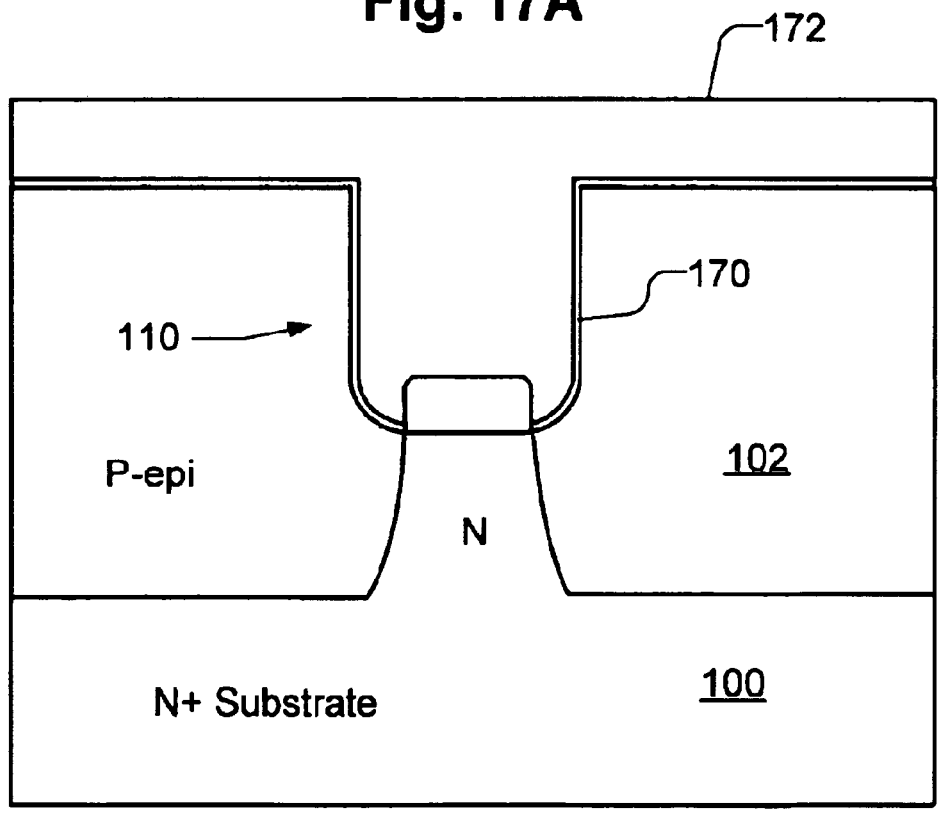
Figure 17C:
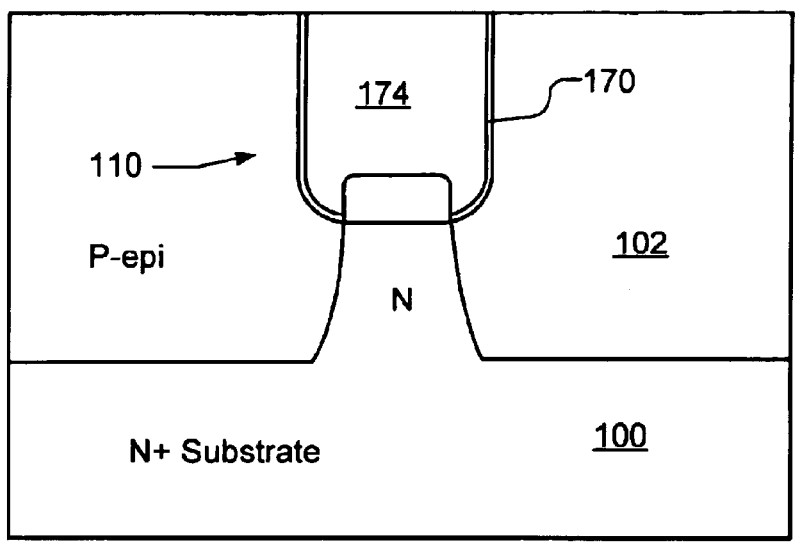

As shown in FIG. 17B, a layer 172 of polysilicon or another conductive material is deposited (for example, by a low pressure CVD (LPCVD) process) to fill trench 110 and overflow the horizontal surface of oxide layer 170. Polysilicon layer 172 may be, for example, an in-situ doped polysilicon, or an undoped polysilicon layer that is subsequently implanted and annealed, or an alternative conductive material. Polysilicon layer 172 is etched, typically using a reactive ion etch, until the top surface of polysilicon layer 172 is approximately level with the top of P-epi layer 102, thereby forming a gate 174, as shown in FIG. 17C. In an N-type MOSFET, gate 174 may be, for example, a polysilicon layer doped with phosphorus to a concentration of $1 \times 10^{19}$ cm$^{-3}$. In some embodiments, polysilicon layer 172 may be etched past the top of trench 110, thereby recessing gate 174 to minimize the gate-to-source overlap capacitance, and an oxide or other insulating layer may be formed over gate 174. In many cases, polysilicon layer 172 is etched through an opening in a second (gate poly) mask that allows a portion of the polysilicon layer 172 to remain in place where the gate 174 is to be contacted by a gate metal portion of metal layer 184 (see FIG. 17I)

Figure 10A:
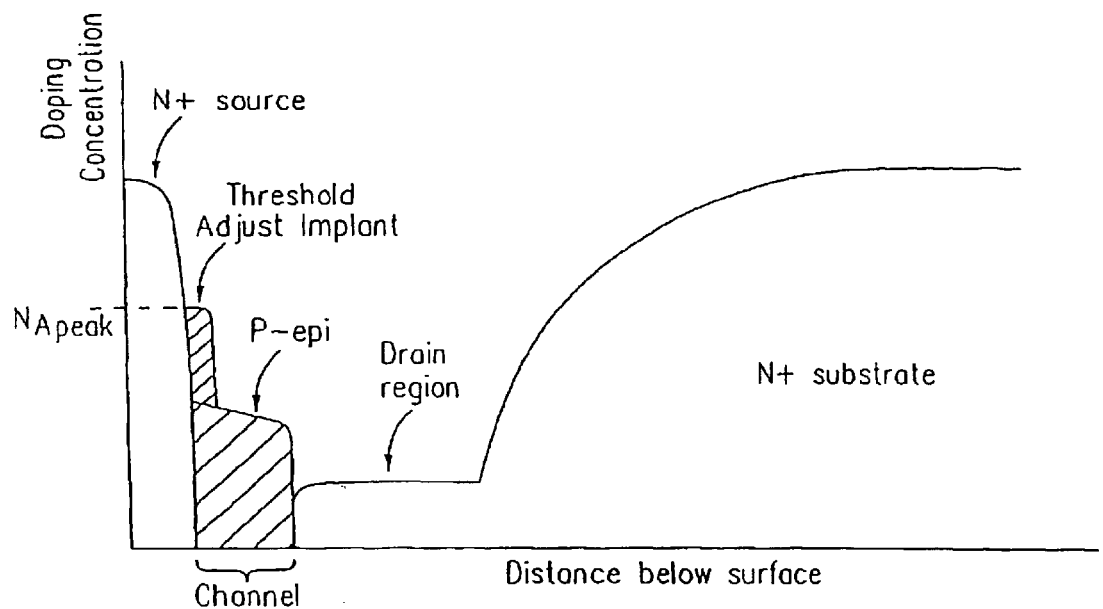
FIGS. 10A and 10B are doping profile graphs similar to the graph of FIG. 9B illustrating the addition of a threshold adjust implant and a body implant, respectively.

Optionally, if the threshold voltage is to be adjusted, a threshold adjust implant may be performed, for example, by implanting boron through the surface of P-epi layer 102. The boron may be implanted at a dose of $5 \times 10^{12}$ cm$^{-2}$ and at an energy of 150 keV, yielding a concentration of P-type atoms of $1 \times 10^{17}$ cm$^{-3}$ in the portion of P-epi layer 102 which will form the channel of the MOSFET. As described above, FIG. 10A shows the dopant profile at a vertical cross-section taken through the channel, showing a threshold adjust implant. As shown, the threshold adjust implant is typically located in an area of the channel just below the source region. The threshold voltage of the MOSFET is determined by the peak doping concentration $N_{A\ peak}$ of the threshold adjust implant. If the threshold voltage of the device does not need to be adjusted, this step can be omitted.

Figure 10B:
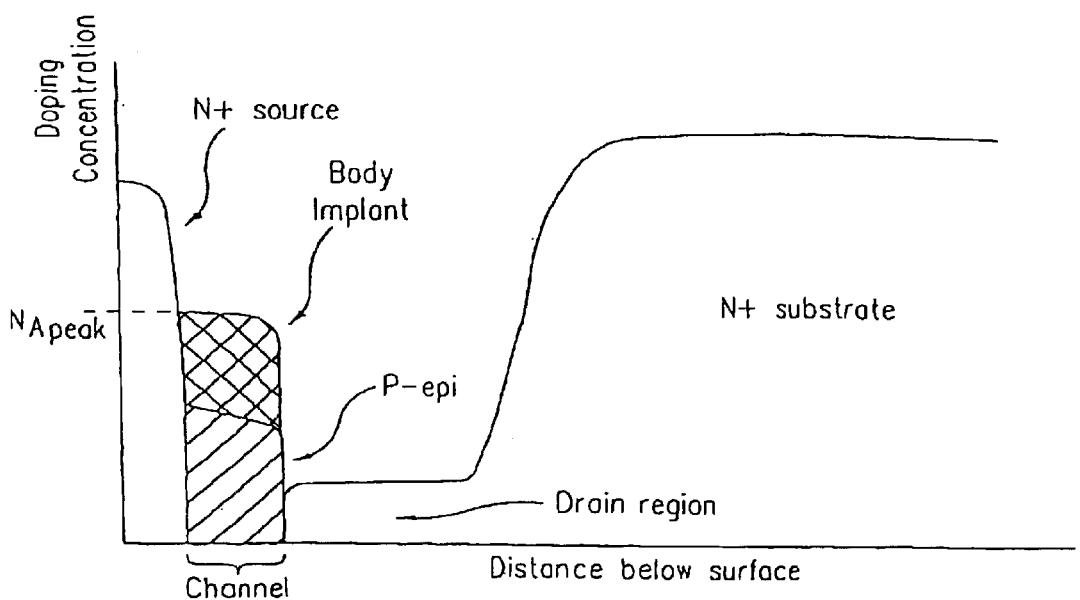
Figure 17D:
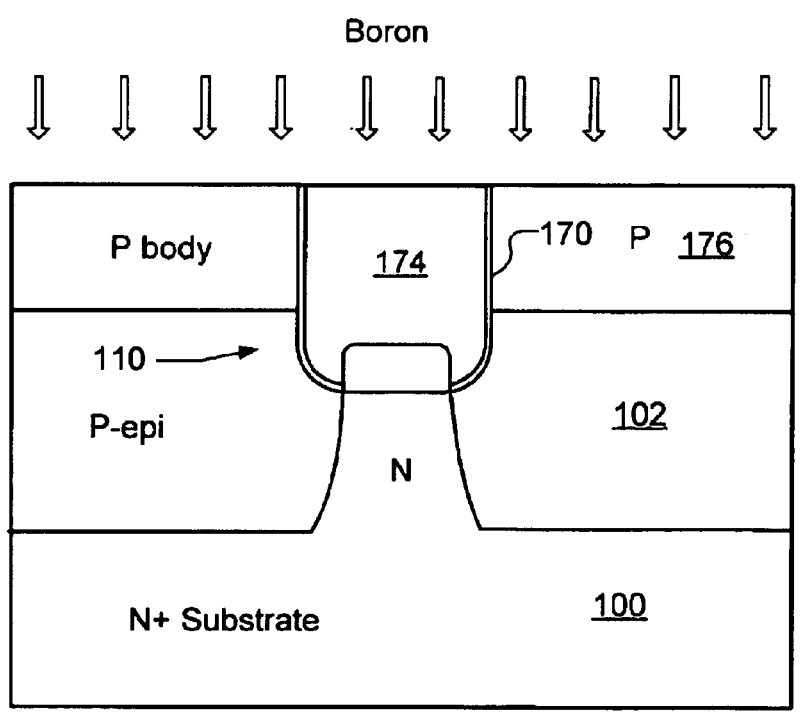

If desired, a P-type dopant such as boron may be implanted to form a body region 176 as shown in FIG. 17D. The doping profile of a typical body implant is illustrated in the graph of FIG. 10B. The body implant is somewhat similar to the threshold adjust implant but the energy used is higher and as a result the body, implant extends to a level nearer the junction between the P-epi layer and the N drain-drift region. The threshold voltage of the MOSFET is determined by the peak doping concentration $N_{A\ peak}$ of the body implant. Alternatively, the P body implant may be driven to a level below the bottom of trench 110 but above the interface between P-epi 15 layer 102 and N+ substrate 100, as shown by body region 186 in FIG. 17E.

Figure 17E:
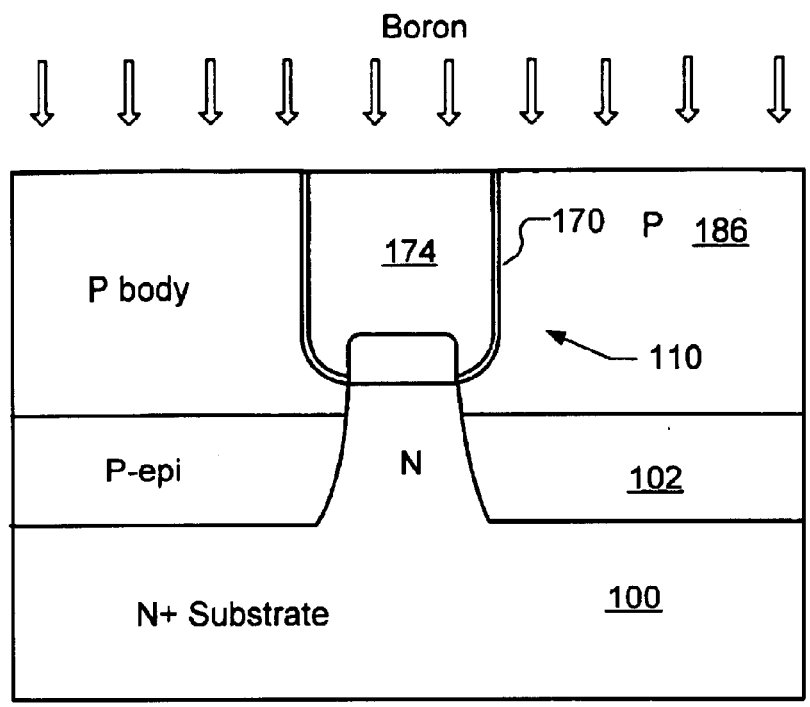
Figure 17F:
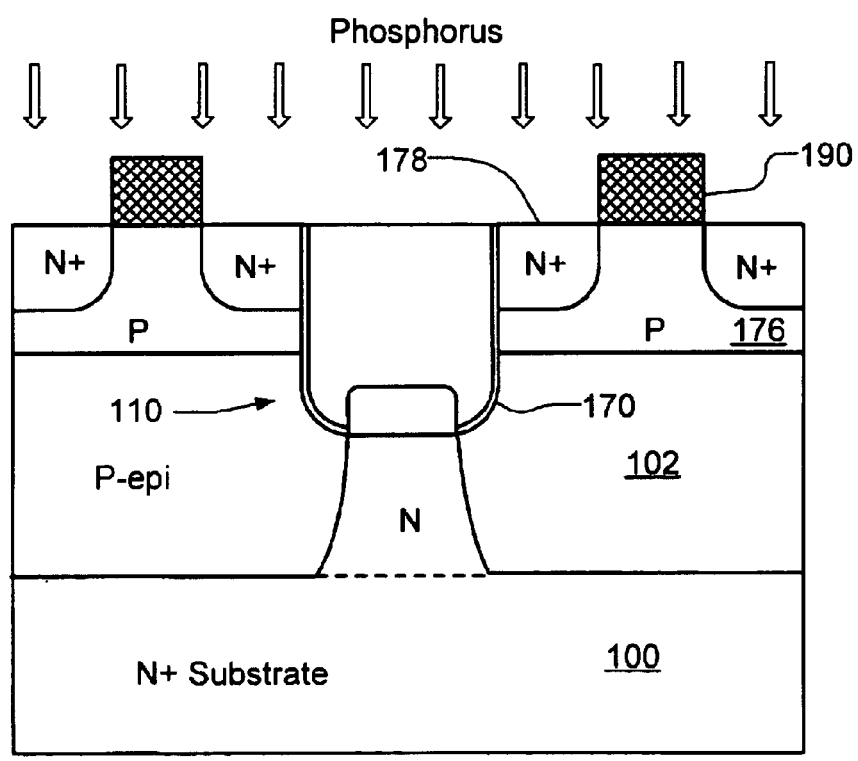
Figure 17G:
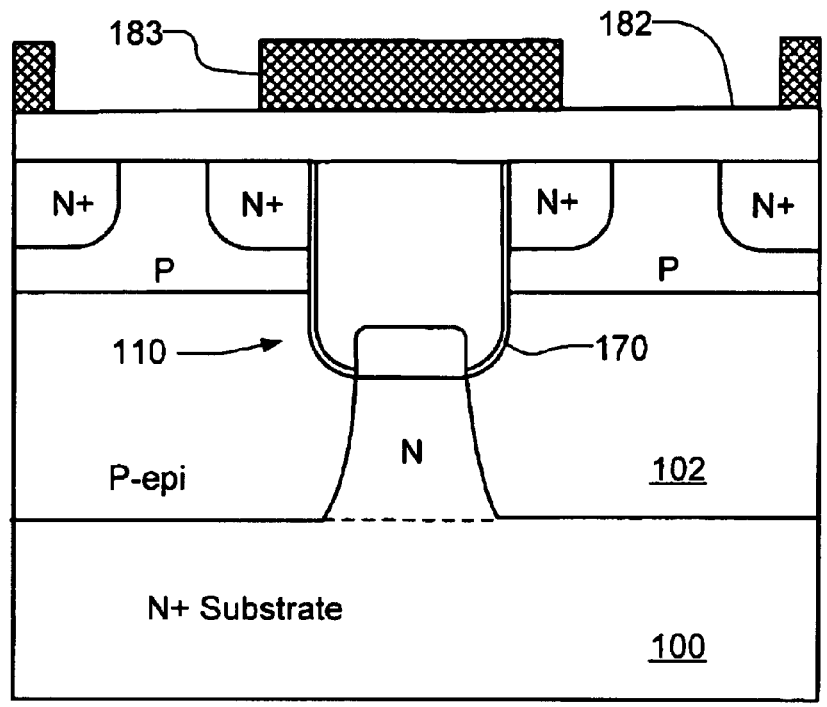
Figure 17H:
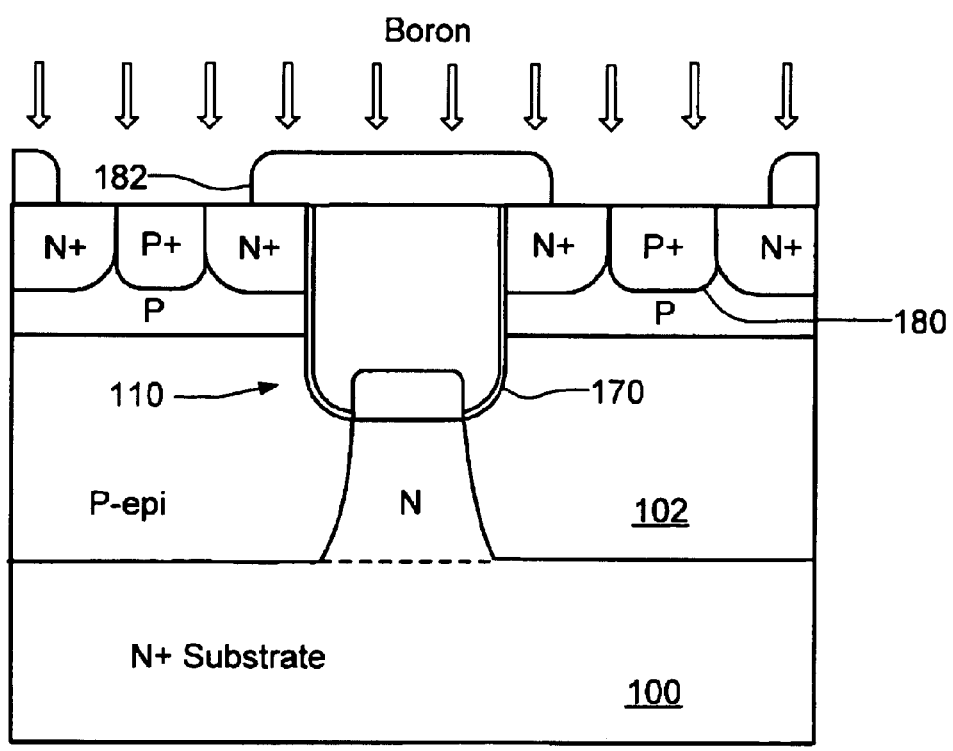

Next, the top surface of P-epi layer 102 may be masked with a third (source) mask 190 and an N-type dopant such as phosphorus may be implanted to form N+ source regions 178, shown in FIG. 17F. Source mask 190 is removed. A BPSG layer 182 is deposited on the top surface of the device and a fourth (contact) mask 183 is deposited and etched on the surface of BPSG layer 182, as shown in FIG. 17G. BPSG layer 182 is etched through the openings in contact mask 183, and a P-type dopant is implanted through the resulting openings in BPSG layer 182 to form P+ body contact regions 180, as shown in FIG. 17H. For example, N+ source regions 178 can be implanted with arsenic at a dose of $5\times10^{15}$ cm$^{-2}$ and an energy of 80 keV, yielding a concentration of $1\times10^{20}$ cm$^{-3}$; P+ body contact regions 180 can be implanted with boron at a dose of $1\times10^{15}$ cm$^{-2}$ and an energy of 60 keV, yielding a dopant concentration of $5\times10^{19}$ cm$^{-3}$.

Figure 17I:
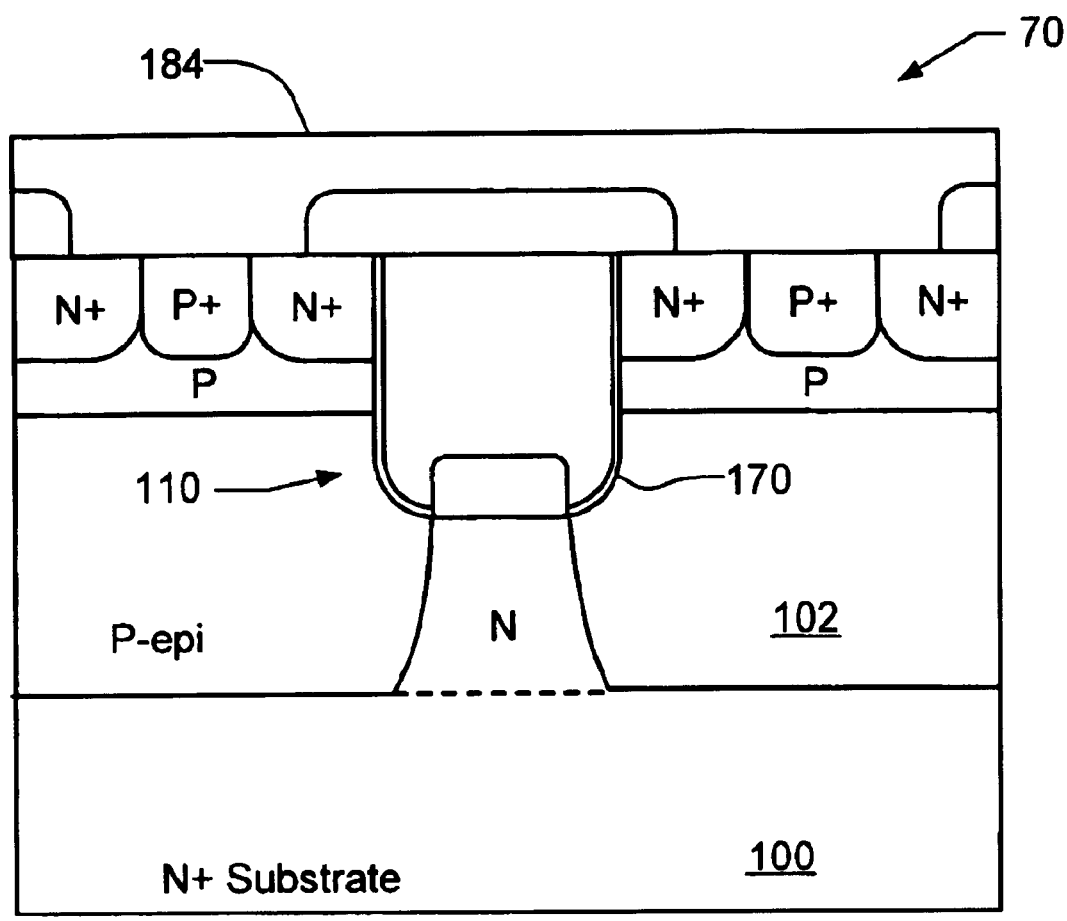

A metal layer 184, preferably aluminum, is deposited as shown in FIG. 17I, establishing a short between source regions 178 and body contact regions 180. A fifth (metal) mask (not shown) is used to pattern and etch metal layer 184 into a source metal portion, shown in FIG. 17I, and a gate metal portion that is used to establish electrical contact to the gate. This completes the fabrication of MOSFET 70.

Figure 18A:
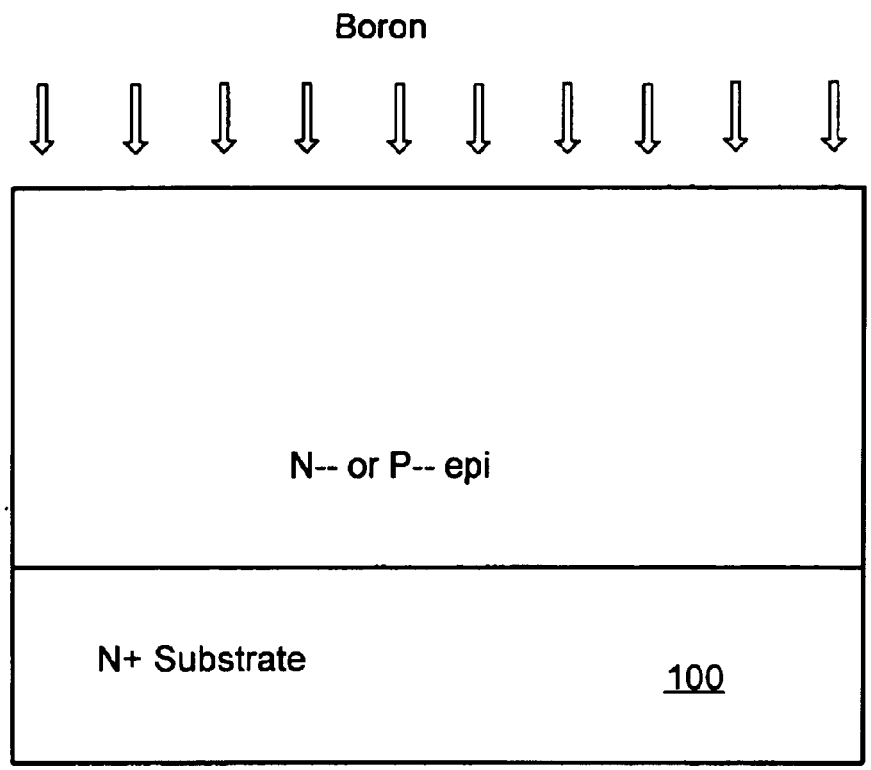
FIGS. 18A and 18B show an embodiment wherein the epi layer is initially lightly doped with either N-type or P-type impurity and a P-type is implanted as a body dopant.
Figure 18B:
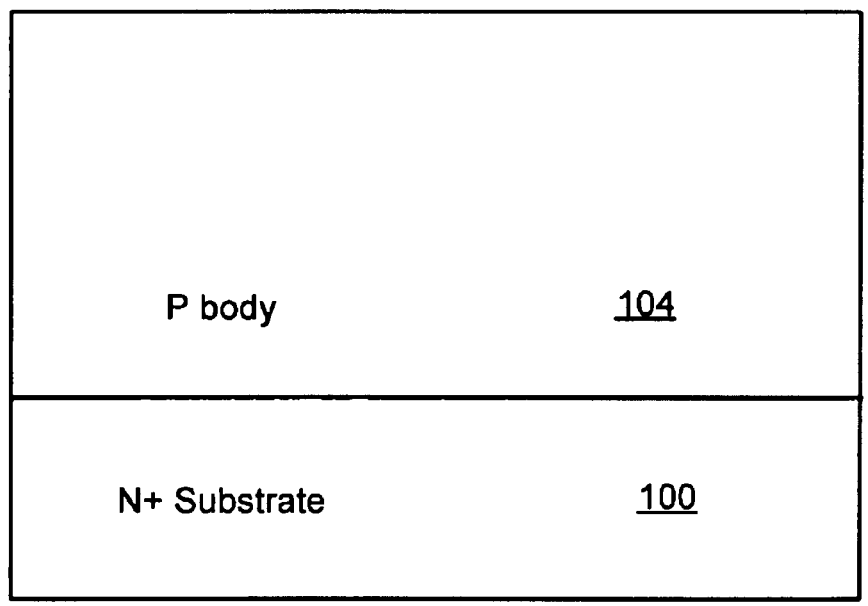

In another embodiment, the epi layer is initially lightly doped with either N-type or P-type impurity, and a P-type impurity such as boron is implanted as a body dopant and is driven in until the dopant reaches the interface between the epi layer and the substrate. Such an embodiment is illustrated in FIGS. 18A and 18B. As shown in FIG. 18B, when the boron has been implanted and diffused, a P body region is formed on the N+ substrate 102.

The structures containing P body 176 as shown in FIG. 17D, P body 186 shown in FIG. 17E, and P body 104 as shown in FIG. 18B, can be used in conjunction with any of the processes for forming a drain-drift region described herein. That includes the process shown in FIGS. 12J and 12K, involving the up-diffusion of a deep implanted layer; the process shown in FIGS. 12L and 12M, involving the up-diffusion of a deep implanted layer and down diffusion of an implanted region below the bottom of the trench; and the process shown in FIG. 12N, involving the implanting of multiple N-type regions at different energies to form a stack of overlapping regions.

Figure 6:
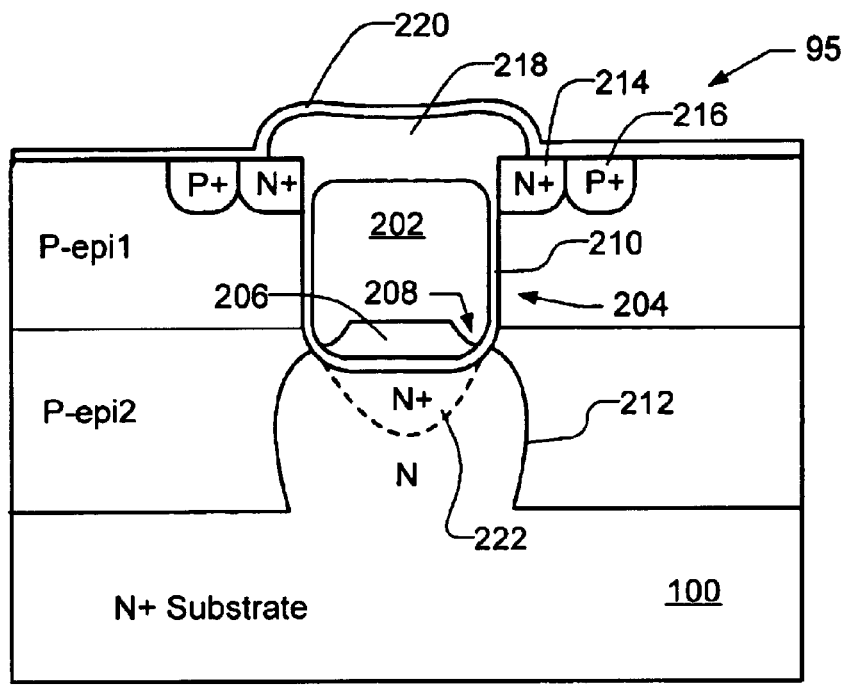
FIG. 6 shows an MIS device according to this invention wherein the epi layer is divided into two sublayers having different doping concentrations.

FIG. 6 shows an alternative embodiment. In MOSFET 95 the P-epi layer is divided into sublayers Pepi1 and Pepi2. Using a well-known process, an epi layer having sublayers can be formed by varying the flow rate of the dopant gas while the epi layer is being grown. Alternatively, sublayer Pepi1 can be formed by implanting dopant into the upper portion of the epi layer.

The dopant concentration of sublayer Pepi1 can be either greater than or less than the dopant concentration of sublayer Pepi2. The threshold voltage and punchthrough breakdown of the MOSFET are a function of the doping concentration of sublayer Pepi1, while the breakdown voltage and on-resistance of the MOSFET are a function of the doping concentration of sublayer Pepi2. Thus, in a MOSFET of this embodiment the threshold voltage and punchthrough breakdown voltage can be designed independently of the avalanche breakdown voltage and on-resistance. The P-epi layer may include more than two sublayers having different doping concentrations.

MOSFET 95 includes a gate electrode 202 that is positioned in a trench 204, which is lined with an oxide layer. The upper surface of gate 202 is recessed into trench 204. The oxide layer includes a thick section 206, formed in accordance with this invention, which is located generally at the bottom of trench 204, and relatively thin sections 210 adjacent the sidewalls of trench 204. Between thick section 206 and thin sections 210 are transition regions 208, where the thickness of the oxide layer decreases gradually from thick section 206 to thin sections 210. MOSFET 100 also includes PN junctions, which intersect trench 204 in the transition regions 208. As described above, the location of transition regions 208 can be varied by altering the thickness of the nitride layer during the fabrication of MOSFET 95.

MOSFET 95 also includes N+ source regions 214, P+ body contact regions 216, a thick oxide layer 218 overlying gate electrode 202, and a metal layer 220 that makes electrical contact with N+ source regions 214 and P+ body contact regions 216. As shown by the dashed lines, MOSFET 95 contains a highly doped region 222 at the bottom of trench 204. Highly doped region 222 may be created by implanting an N-type dopant, such as arsenic or phosphorous, after the nitride layer has been etched as shown in FIG. 12O.

Figure 20:
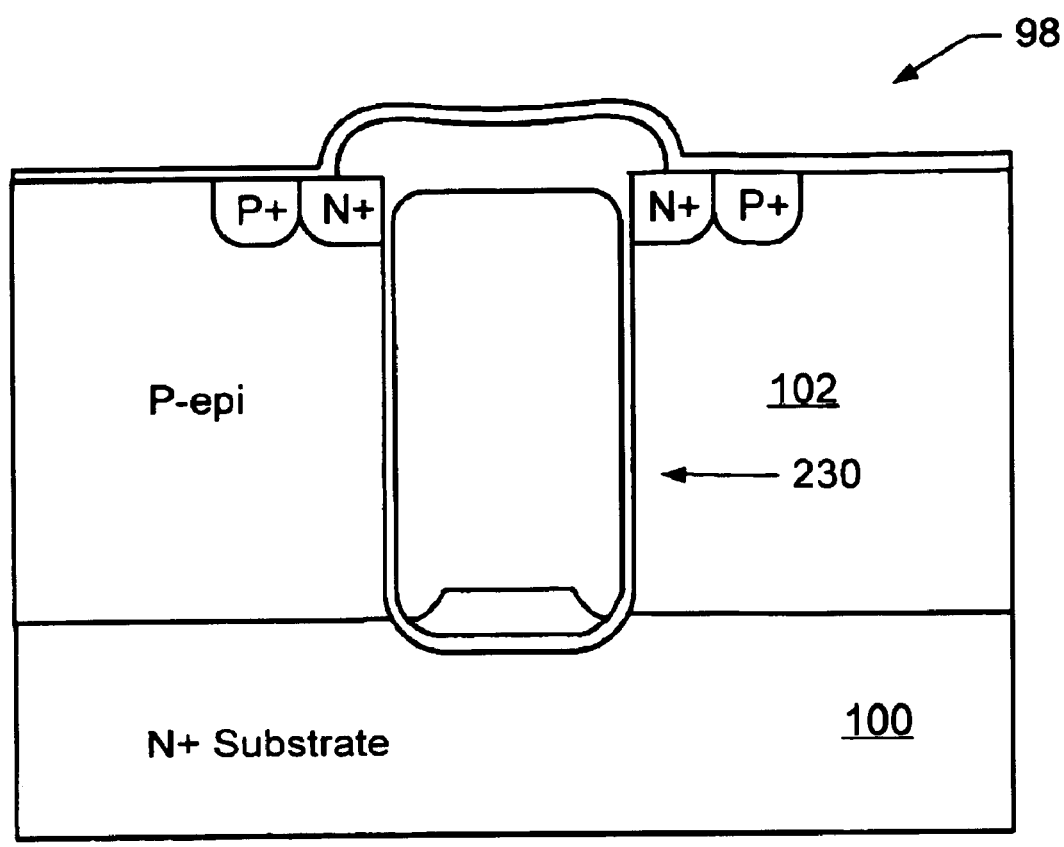
FIG. 20 shows an embodiment wherein the drain-drift region is omitted and the trench extends through the epi layer into the substrate.

FIG. 20 shows another alternative embodiment. In MOSFET 98 a drain-drift region is omitted, and trench 230 extends entirely through P-epi layer 102 into N+ substrate 100. This embodiment is particularly suitable for low-voltage (e.g., 5 V or less) MOSFETs.

In order to increase the breakdown voltage of the device, a lightly-doped N-type epi layer can be grown on top of the N+ substrate 100, underneath the P-epi layer 102. Several embodiments of this structure are shown in FIGS. 21–25.

Figure 21:
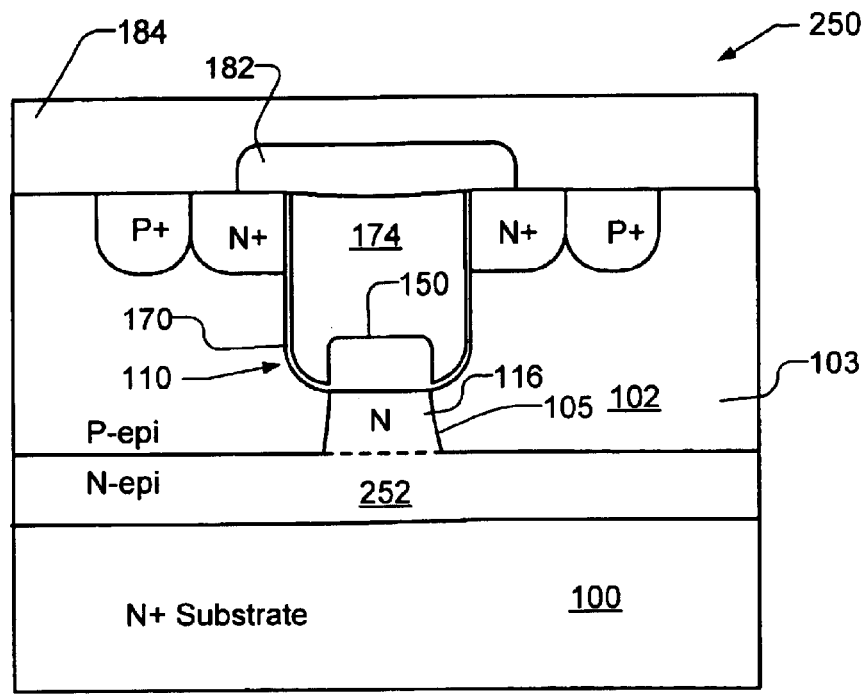
FIGS. 21–25 show embodiments in which a lightly doped epi layer of the same conductivity type as the substrate is formed on the substrate to increase the breakdown voltage of the device.

FIG. 21 shows a MOSFET 250 which is similar to MOSFET 70 shown in FIG. 5A, except that an N-epi layer 252 has been grown on top of N+ substrate 100. N-epi layer 252 could be from 1 to 50 μm thick and could be doped with phosphorus to a concentration of from $1\times10^{15}$/cm$^{-3}$ to $1\times10^{17}$/cm$^{-3}$. The doping concentration of N-epi layer 252 may be either higher or lower than the doping concentration of P-epi layer 102.

Apart from the growth of N-epi layer 252, the process of fabricating MOSFET 250 is similar to the process of fabricating MOSFET 70, described above in conjunction with FIGS. 12A–12G. In particular, as shown in FIG. 12G, phosphorus may be implanted through the bottom of the trench to form drain-drift region 116. The energy and dose of the phosphorus implant are set, however, to ensure that drain-drift region 116 extends downward to the upper boundary of N-epi layer 252 rather than to the upper boundary of N+ substrate 100.

Figure 22:
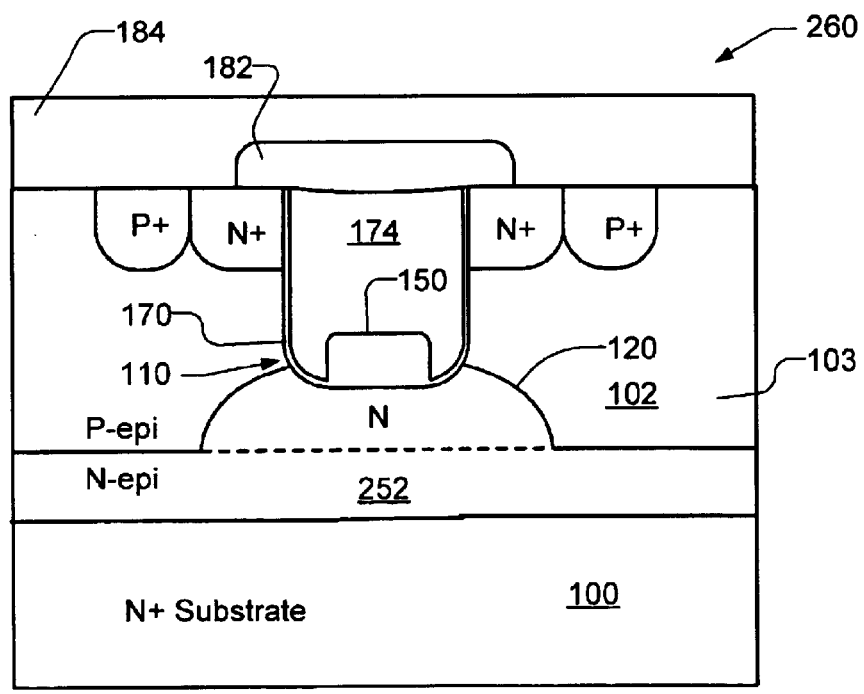

FIG. 22 shows a MOSFET 260 which has a drain-drift region 120 similar to drain drift region 120 shown in FIG.

12I. MOSFET 260 is formed by implanting the phosphorus to form an N-type region immediately below the trench (see FIG. 12H), and then diffusing the phosphorus by heating so that the N-type region expands downward and laterally to form drain-drift region 120 shown in FIG. 22.

Figure 23:
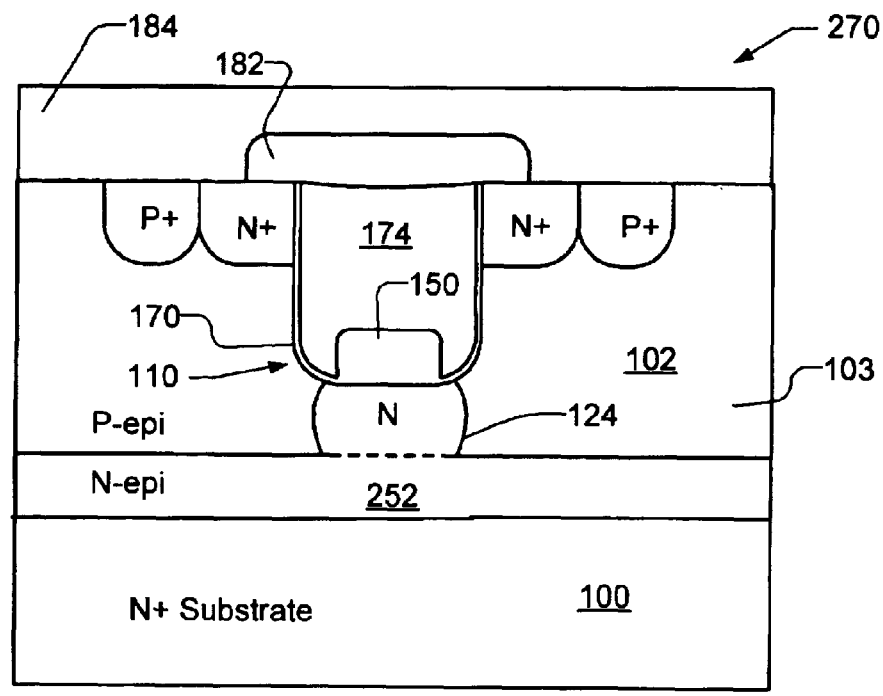

FIG. 23 shows a MOSFET 270 which has a drain-drift region 124 is similar to drain-drift region 124 shown in FIG. 12K MOSFET 270 is formed by implanting the phosphorus to form an N-type region near the interface between N-epi layer 252 and P-epi layer 102 (see FIG. 12J), and then diffusing the phosphorus by heating so that the N-type region expands upward and laterally to form drain-drift region 124 shown in FIG. 23.

Figure 24:
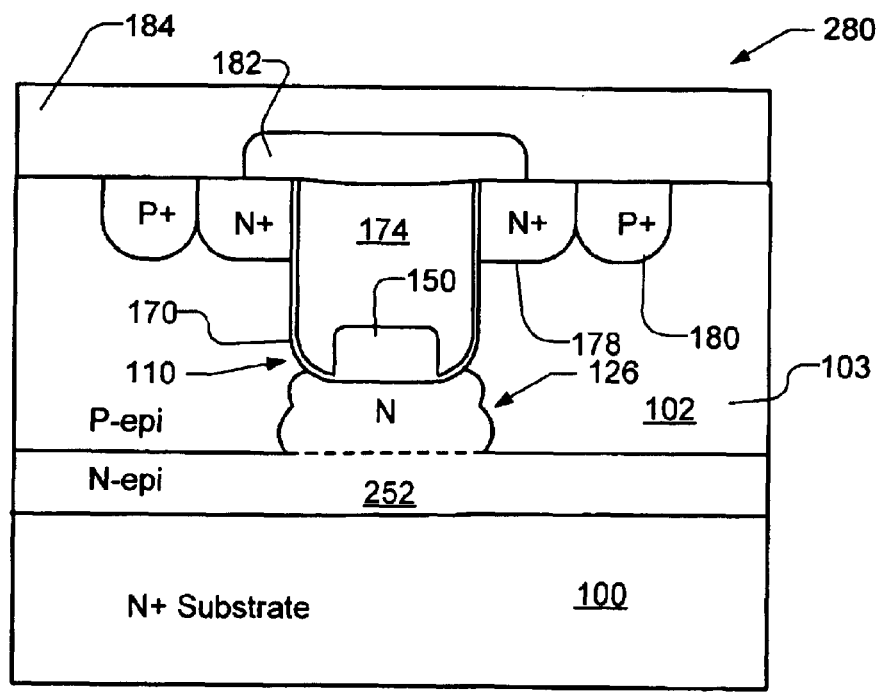

FIG. 24 shows a MOSFET 280 which has a drain-drift region 126 similar to drain-drift region 126 shown in FIG. 12M. To fabricate MOSFET 280, a deep N layer (e.g., phosphorus) is formed at the interface of N-epi layer 252 and P epi layer 100 by a high-energy implant process. An N-type dopant is implanted through the bottom of the trench to form a second N region immediately beneath the trench. The structure is then heated, for example, to 900 to 1000° C. The deep N layer diffuses upward and the second N region diffuses downward until they merge, forming N-type drain-drift region 126, as shown in FIG. 24.

Figure 25:
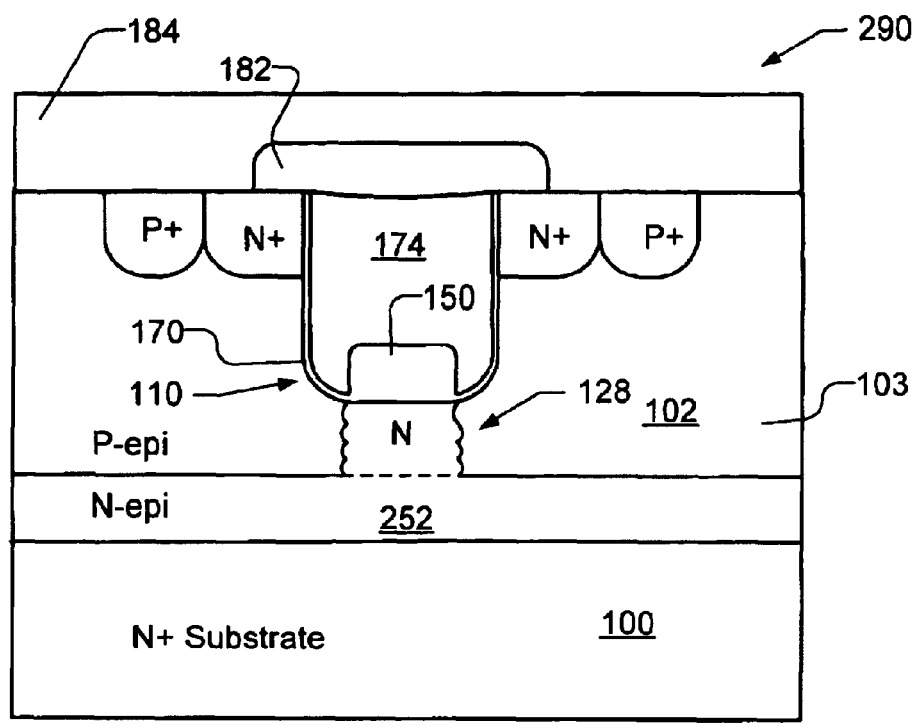

FIG. 25 shows a MOSFET 290 containing a drain-drift region formed of a series of N implants performed at successively greater energies to create a stack of overlapping implanted regions 128, similar to the structure shown in FIG. 12N. The stack 128 includes four implanted regions, but fewer or more than four implants could also be used to form the stack. The stack could be formed with no significant diffusions (i.e., no heating), or it could be heated to diffuse the dopant and increase the amount of overlap between the implanted regions.

Figure 26:
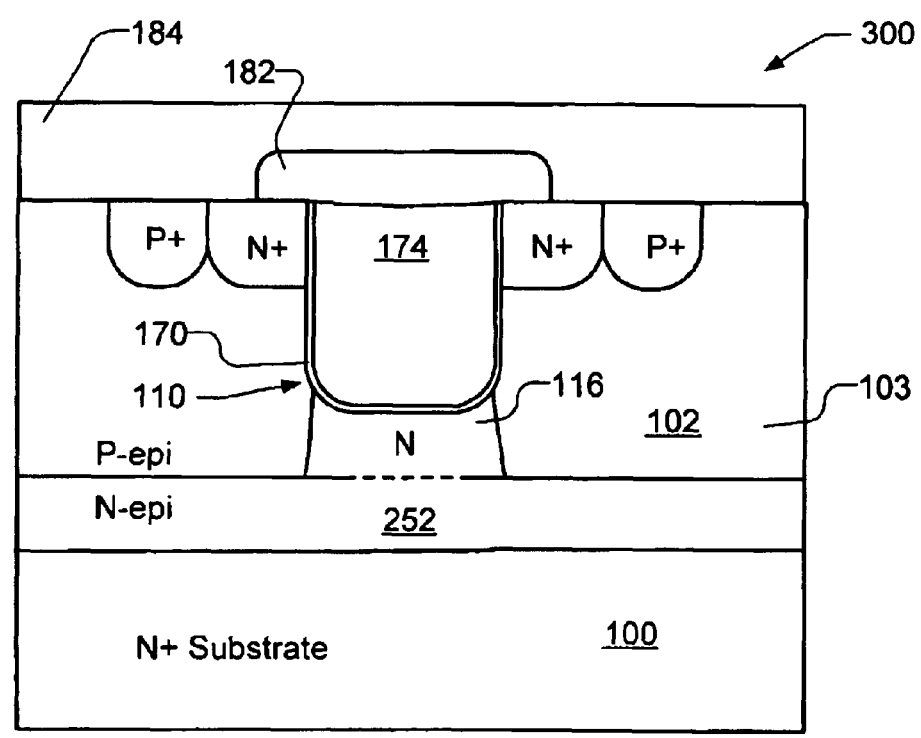
FIG. 26 shows a MOSFET similar to the MOSFET shown in FIG. 21, except that the thick bottom oxide has been omitted.

Another group of embodiments are similar to those shown in FIGS. 21–25 except that the thick bottom oxide region 150 is omitted, and the bottom of the trench is lined with an oxide layer having substantially the same thickness as the oxide layer 170 that lines the walls of trench 110. To fabricate devices of this kind, an N-type dopant such as phosphorus is implanted through the bottom of trench 110 at the stage of the process shown in FIG. 12C, and the deposition of nitride layer 114 and the formation of sidewall spacers 115, shown in FIGS. 12E and 12F, are omitted. If the N-type dopant is implanted so as to extend downward from the bottom of the trench, as shown in FIG. 12G, a MOSFET 300, shown in FIG. 26, results. Alternatively, a drain-drift region of the kind shown in FIGS. 12H–12I, 12J–12K, 12L–12M, and 12N can be fabricated by following the processes described in connection with those figures. In all cases the drain-drift region extends from the bottom of trench 110 to the junction of N-epi layer 252.

Termination Region

Devices fabricated in accordance with this invention are typically formed in semiconductor dice that are initially part of a semiconductor wafer. After the internal structures of the devices have been fabricated, the dice are separated from each other, typically by sawing the wafer at scribe lines that separate the dice. One series of parallel saw cuts is made, and then a second series of saw cuts is made in a direction perpendicular to the first series of cuts.

As described above, N-channel devices according to this invention are generally formed in a P-epi layer overlying an N+ substrate, or in a P-epi layer overlying an N-epi layer that overlies an N+ substrate. Of course, these polarities would be reversed for P-channel devices. Typically, in an N-channel device the drain (N+ substrate) biased at some positive voltage and the N+ source is grounded. Since the P-body is normally shorted to the N+ source, the P-body is also grounded. The gate voltage would normally vary between zero and some positive voltage as the device is turned off and on.

The sawing process normally creates current leakage paths at the edge of the die, and therefore, when the N-channel device is turned off, the P-epi layer could reach the positive drain voltage. A termination structure is necessary to prevent breakdown or current leakage between the P-epi layer and the N+ source.

Figure 27:
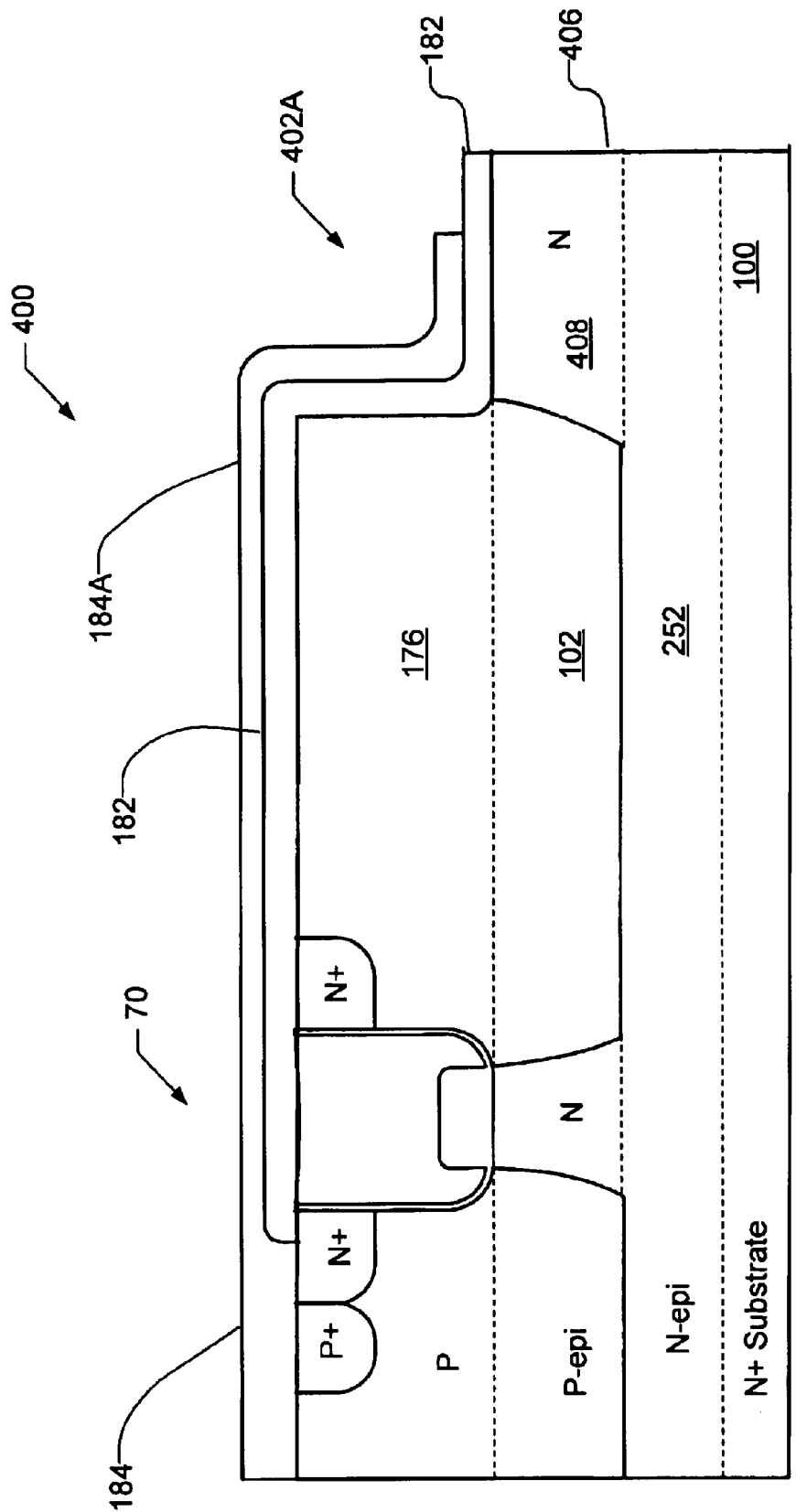
FIG. 27 shows a termination region for a MOSFET in accordance with this invention.

FIG. 27 shows MOSFET 70 from FIG. 5A adjacent a termination area 400. Termination area 400 includes a half-trench 402A that extends to an edge 406 of the die. An N region 408 extends downward from half-trench 402A through P-epi layer 102 to N-epi layer 252. P-epi layer 102 contains a P body layer 176. A source metal layer 184A, which contacts the N+ source and P-body of MOSFET 70, extends over BSPG layer 182 into half-trench 402A but stops short of edge 406, where there is a risk of electrical contact with the drain via the current leakage paths described above. In this structure, the portion of source metal layer 184A that extends into termination region 400 acts as a field plate for the junction between N region 408 and P-epi layer 102, spreading out the electrical lines of force and preventing breakdown across that junction.

Figure 28A:
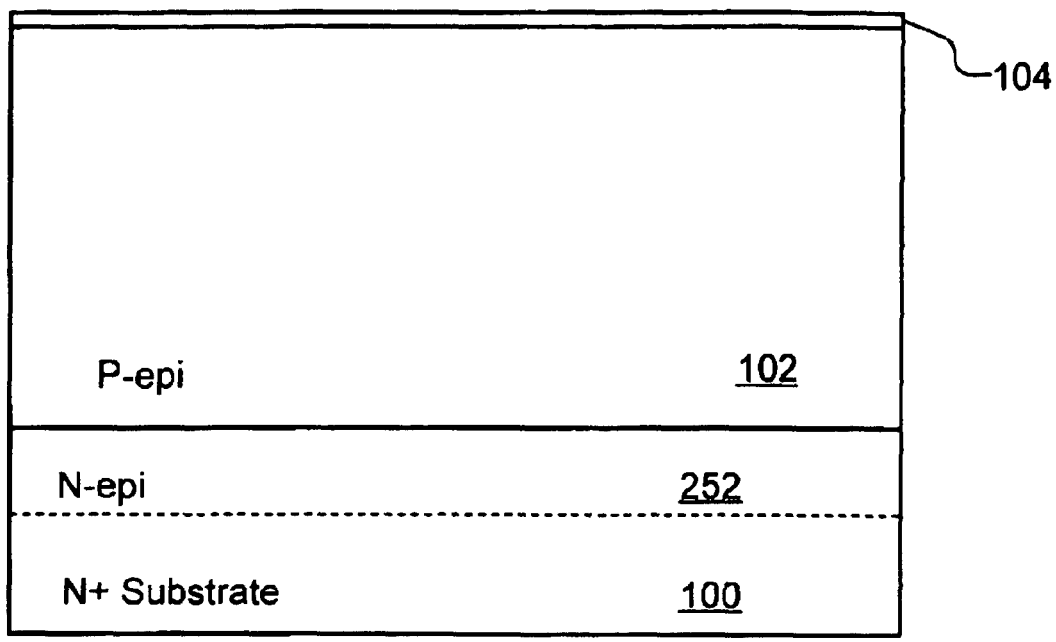
FIGS. 28A–28G illustrate a process for fabricating the termination region of FIG. 27.

FIGS. 28A–28E illustrate a method of fabricating termination region 400 with no process steps in addition to those required to fabricate MOSFET 70. The process generally parallels the processes described above, for example the process depicted in FIGS. 12A–12G. As shown in FIG. 28A, the process starts with N-epi layer 252 and P-epi layer 102 overlying N+ substrate 100. Pad oxide layer 104 is formed atop P-epi layer 102.

Figure 28B:
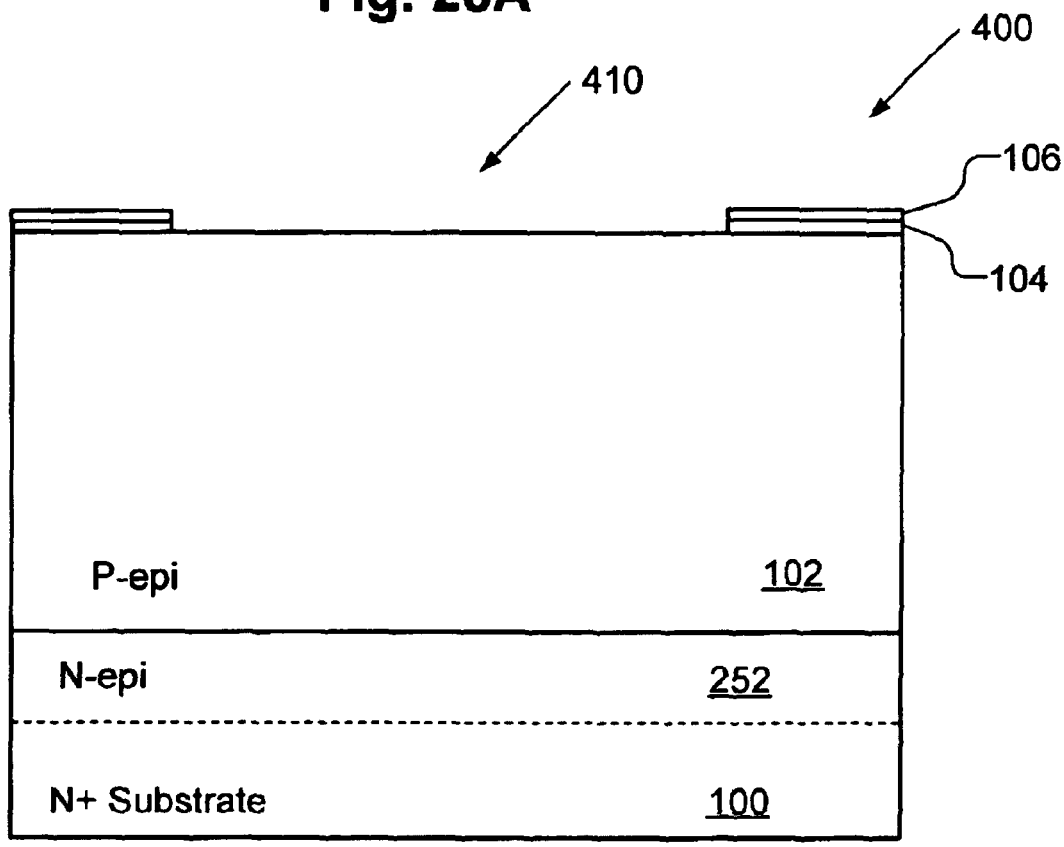

As shown in FIG. 28B, nitride layer 106 is deposited on pad oxide layer 104. Nitride layer 106 and pad oxide layer 104 are patterned using photolithographic processes, and an opening 410 is formed in nitride layer 106 and pad oxide layer 104. Opening 410 coincides with a scribe line between adjacent dice. This may be performed simultaneously with the step shown in FIG. 12B.

Figure 28C:
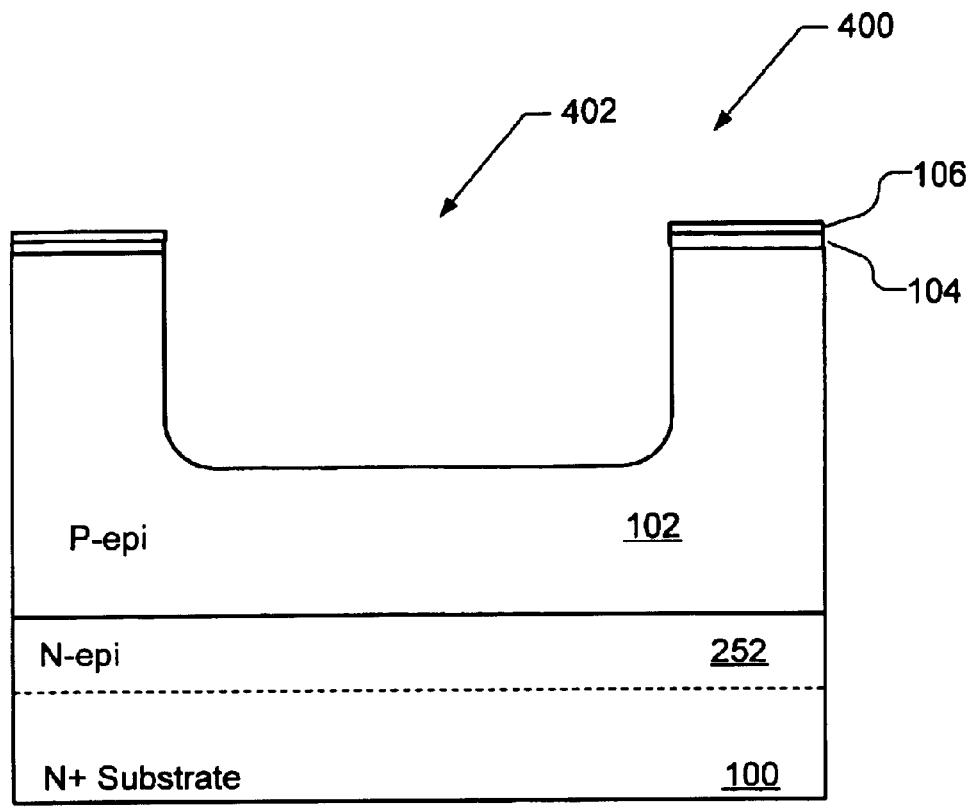

As shown in FIG. 28C, a wide trench 402 is etched in P-epi layer 102 through opening 410. This may be performed at the same time as the step shown in FIG. 12C.

Figure 28D:
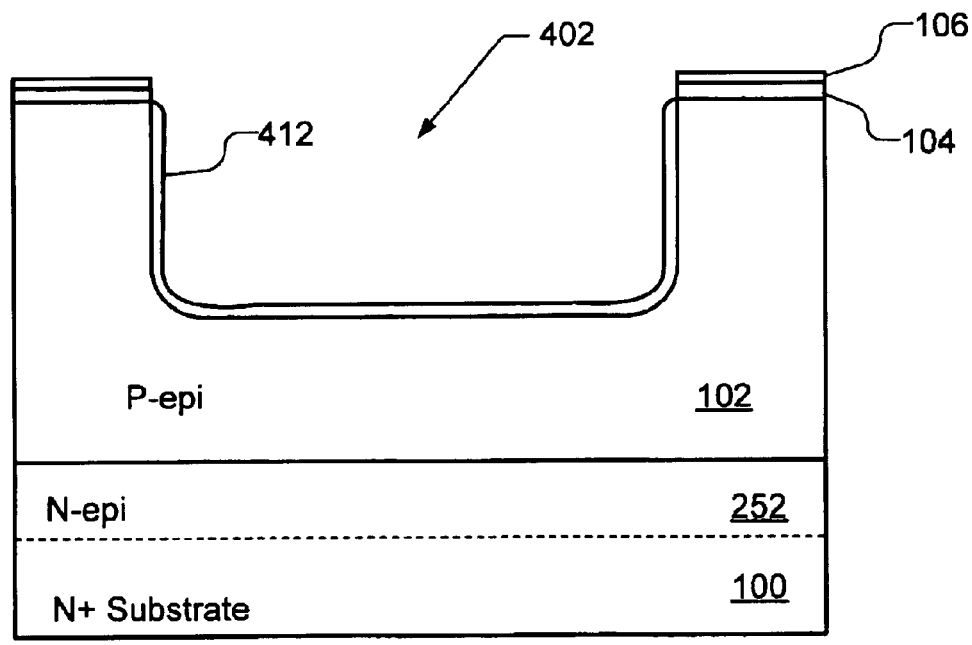

FIG. 28D shows the growth of the second pad oxide layer 412 in trench 402. This may be performed simultaneously with the growth of pad oxide layer 112, shown in FIG. 12D.

Figure 28E:
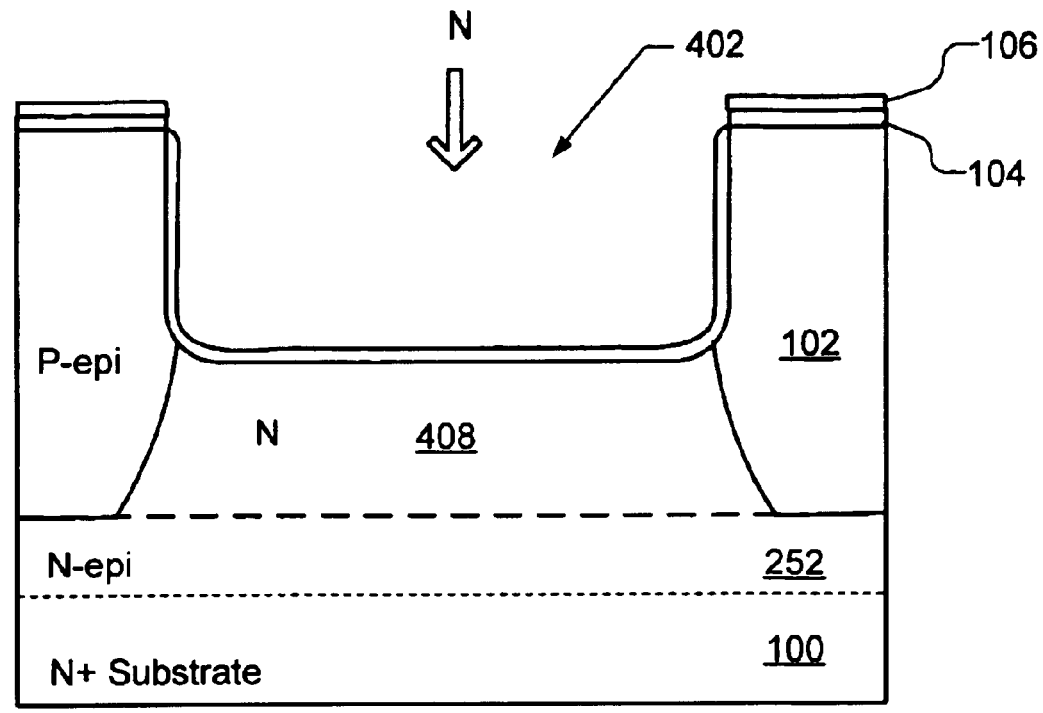

When the drain-drift region is implanted, as shown in FIG. 12G, for example, trench 402 is left exposed, and the dopant enters P-epi layer 102. In any of the ways described above, the dopant is implanted and/or diffused to form N-type region 408 extending from the bottom of trench 402 to N-epi layer 252. This stage of the process is shown in FIG. 28E. No thick bottom oxide layer is formed in wide trench 402. Therefore, nitride spacers 115 are not formed on the sidewalls of wide trench 402 (see FIGS. 12E and 12F) and the N-type dopant is implanted using nitride layer 106 as a mask.

As described above, at a later point in the process a BPSG layer 182 may be deposited and patterned to cover the gate electrodes in the active area of the device. The deposition and patterning of BPSG 182 layer is shown in FIGS. 17G and 17H, for example. This is followed by the deposition of metal layer 184, as shown in FIG. 17I. These layers are also deposited in wide trench 402. When metal layer 184 is patterned to separate it into source metal and gate metal layers, the portion of source metal layer 184A in the central region of wide trench 402 is also etched, yielding the structure shown in FIG. 28F. This is accomplished by a normal photolithographic patterning and etch. As a result, source metal layer 184A extends into wide trench 402.

After BPSG layer 182 and metal layer 184 have been deposited, a passivation layer (not shown) may be deposited to protect the top surface of the device.

Figure 28F:
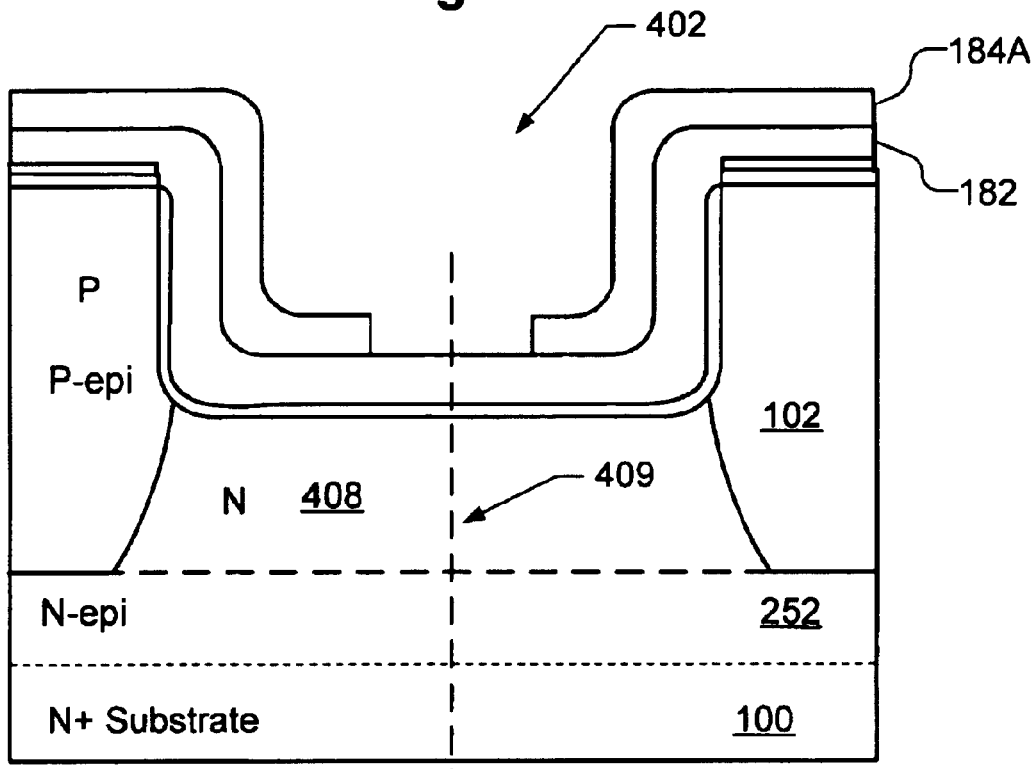

After these processes have been performed, the die is sawed at the center of wide trench 402, for example at the dashed line 409 in FIG. 28F.

Figure 28G:
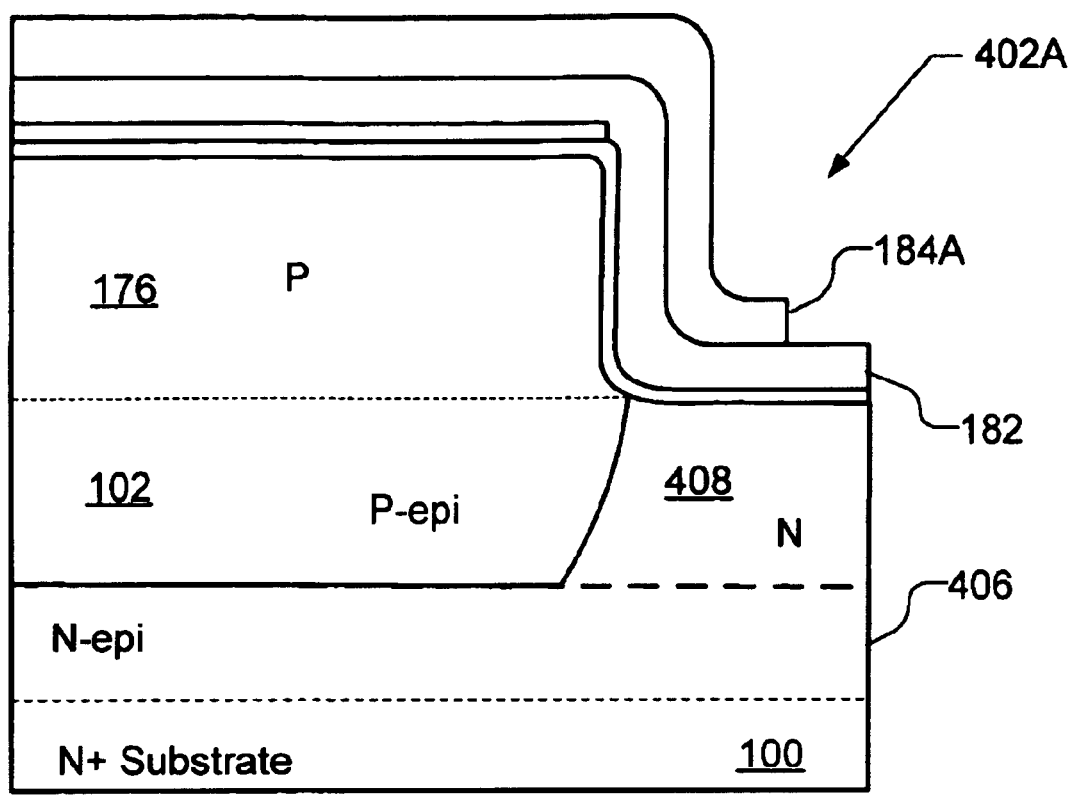

This yields the structure shown in FIG. 28G, with the saw cut producing half-trench 402A located at the edge 406 that is formed by the saw cut. As shown, BPSG layer 182 and metal layer 184A extend from the top surface of P-epi layer 102 into half-trench 402A. In this embodiment, P body layer 176 has been implanted and diffused into P-epi layer 102 (see FIG. 17D), but this is optional.

Figure 29:
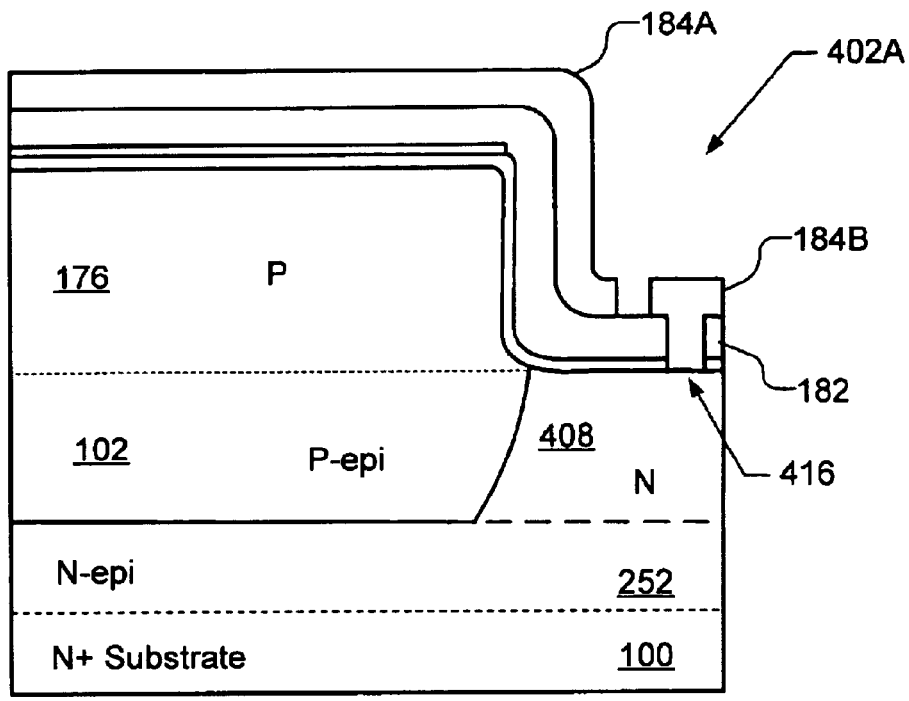
FIG. 29 illustrates a second embodiment of a termination region in accordance with the invention.
Figure 30:
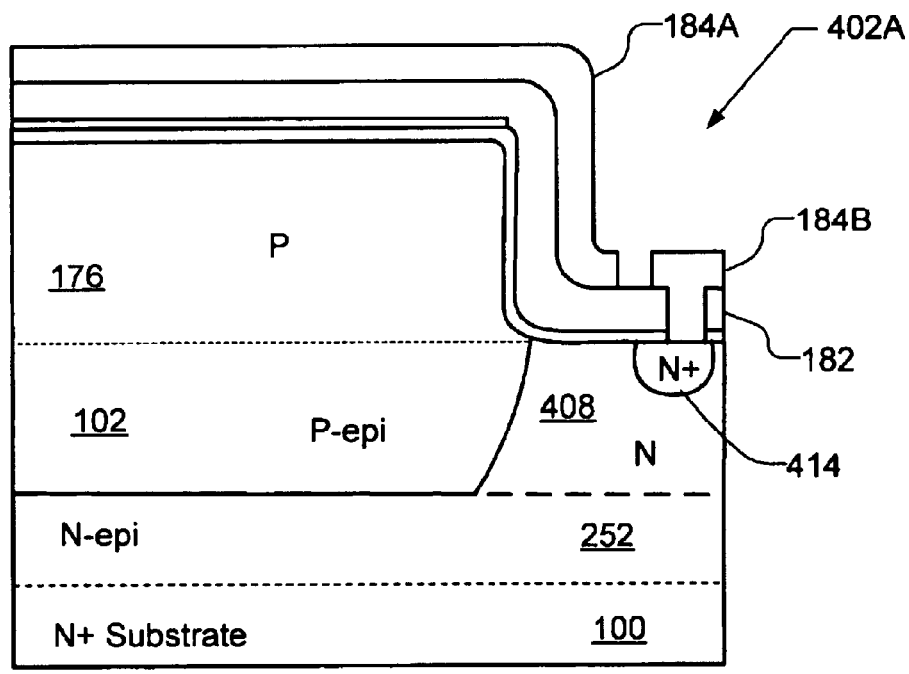
FIG. 30 illustrate a third embodiment of a termination region in accordance with the invention.

FIGS. 29 and 30 illustrate two alternative embodiments. In the embodiment shown in FIG. 29, an opening 416 is formed in BPSG layer 182 and second pad oxide layer 412, and an edge segment 184B is separated from metal layer 184A. These steps are preferably performed simultaneously with the patterning of BPSG layer 182 and metal layer 184, respectively. The metal of layer 184 flows into opening 416, making an ohmic contact with N region 408. Edge segment 184B is thus biased at the drain potential, and the lateral separation between source metal layer 184A and edge segment 184B must be large enough to withstand the source-to-drain voltage. If a passivation layer is later deposited, it will flow into the gap between source metal layer 184A and edge segment 184B.

The embodiment shown in FIG. 30 is similar to the embodiment of FIG. 29, except that an N+ region 414 is formed at the bottom of half-trench 402A to strengthen the ohmic contact between edge segment 184B and N region 408. N+ region 414 may be implanted along with the N+ source regions, as shown in FIG. 17F.

While several specific embodiments of this invention have been described, these embodiments are illustrative only. It will be understood by those skilled in the art that numerous additional embodiments may be fabricated in accordance with the broad principles of this invention. For example, while the embodiments described above are N-channel MOSFETs, a P-channel MOSFET may be fabricated in accordance with this invention by reversing the conductivities of the various regions in the MOSFET.

I claim:

1. A semiconductor die comprising a trench MIS device, said die comprising a first layer of a first conductivity type and a second layer of a second conductivity type overlying said first layer, said die comprising a termination region comprising:

a half-trench formed in said second layer adjacent an edge of said die;

a region of said first conductivity type extending from a bottom of said half-trench to said first layer, an insulating layer extending from said bottom of said half-trench, up a wall of said half-trench and over a surface of said second layer; and a source metal layer over said insulating layer, said source metal layer extending from a location within said half-trench and over a surface of said second layer, said source metal layer being in electrical contact with a source region of said MIS device, an edge of said source metal layer in said half-trench being laterally spaced from said edge of said die.

2. The die of claim 1 further comprising:

a trench located in said second layer in an active region of said die;

a drain-drift region of said first conductivity type extending from a bottom of said trench to said first layer; and a conductive gate in said trench, wherein said insulating layer extends from a location above said trench and into said half-trench.

3. The die of claim 2 wherein said source region is located adjacent said trench.

4. The die of claim 1 comprising a metal edge segment located in said half-trench adjacent said edge of said die, said metal edge segment being electrically isolated from said source metal layer and being in electrical contact with said region of first conductivity type.

5. The die of claim 4 wherein said metal edge segment is in electrical contact with said region of first conductivity type through an opening in said insulating layer at said bottom of said half-trench.

6. The die of claim 5 comprising a heavily-doped region of said first conductivity type within said region of first conductivity type and in contact with said metal edge segment.

7. The die of claim 1 wherein said second layer comprises an epitaxial layer of said second conductivity type.

8. The die of claim 7 wherein said first layer comprises a substrate and an epitaxial layer of said first conductivity type overlying said substrate.

* * * * *